(12) United States Patent
Jaeger et al.

(10) Patent No.: US 9,287,519 B2
(45) Date of Patent: Mar. 15, 2016

(54) OPTOELECTRONIC DEVICE AND METHOD FOR PRODUCING AN OPTOELECTRONIC DEVICE

(71) Applicant: OSRAM Opto Semiconductors GmbH, Regensburg (DE)

(72) Inventors: Arndt Jaeger, Regensburg (DE); Carola Diez, Regensburg (DE); Ulrich Niedermeier, Leiblfing (DE); Stefan Seidel, Wenzenbach (DE); Thomas Dobbertin, Regensburg (DE); Guenter Schmid, Hemhofen (DE)

(73) Assignee: OSRAM OLED GMBH, Munich (DE)

( * ) Notice: Subject to any disclaimer, the term of this patent is extended or adjusted under 35 U.S.C. 154(b) by 0 days.

(21) Appl. No.: 14/469,636

(22) Filed: Aug. 27, 2014

(65) Prior Publication Data

US 2014/0361286 A1    Dec. 11, 2014

Related U.S. Application Data

(63) Continuation-in-part of application No. PCT/EP2013/055132, filed on Mar. 13, 2013.

(30) Foreign Application Priority Data

Mar. 19, 2012 (DE) .......... 10 2012 204 327

(51) Int. Cl.
*H01L 21/00* (2006.01)
*H01L 51/50* (2006.01)
(Continued)

(52) U.S. Cl.
CPC ........ *H01L 51/5056* (2013.01); *H01L 51/0078* (2013.01); *H01L 51/5278* (2013.01); *H01L 51/56* (2013.01)

(58) Field of Classification Search
CPC .................................... H01L 51/0078
See application file for complete search history.

(56) References Cited

U.S. PATENT DOCUMENTS 7,736,754 B2    6/2010 Kijima et al.
2005/0260451 A1    11/2005 Kijima
(Continued)

FOREIGN PATENT DOCUMENTS

CN    1617355 A    5/2005
CN    1703128 A    11/2005
(Continued)

OTHER PUBLICATIONS

International Search Report of PCT/EP2013/055132 dated May 27, 2013.
(Continued)

*Primary Examiner* — Alexander Ghyka
(74) *Attorney, Agent, or Firm* — Viering, Jentschura & Partner mbB

(57) ABSTRACT

An optoelectronic device, comprising: a first organic functional layer structure; a second organic functional layer structure; and a charge generating layer structure between the first organic functional layer structure and the second organic functional layer structure, wherein the charge generating layer structure comprises: a first electron-conducting charge generating layer; wherein the first electron-conducting charge generating layer comprises or is formed from an intrinsically electron-conducting substance; a second electron-conducting charge generating layer; and an interlayer between first electron-conducting charge generating layer; and second electron-conducting charge generating layer; and wherein the interlayer comprises at least one phthalocyanine derivative.

14 Claims, 5 Drawing Sheets

(51) Int. Cl.
*H01L 51/00* (2006.01)
*H01L 51/52* (2006.01)
*H01L 51/56* (2006.01)

(56) References Cited

U.S. PATENT DOCUMENTS

2011/0315968 A1 12/2011 Nowatari et al.
2014/0008623 A1 1/2014 Heuser et al.

FOREIGN PATENT DOCUMENTS

| | | |
|---|---|---|
| DE | 102010062954 A1 | 6/2012 |
| EP | 1718120 A2 | 11/2006 |
| JP | 2006073484 A | 3/2006 |
| JP | 2008234885 A | 10/2008 |
| WO | 2010132236 A1 | 11/2010 |

OTHER PUBLICATIONS

Chinese Office Action based on Application No. 201380015299.1 (9 pages And 8 pages of English translation) dated Nov. 11, 2015.

OPTOELECTRONIC DEVICE AND METHOD FOR PRODUCING AN OPTOELECTRONIC DEVICE

CROSS-REFERENCE TO RELATED APPLICATIONS

This application is a continuation-in-part of PCT application No. PCT/EP2013/055132, filed Mar. 13, 2013, designating the United States, which claims priority to German Patent Application Serial No. DE10 2012 204 327.6, which was filed Mar. 19, 2012. The contents of each application are herein incorporated by reference in its entirety for all purposes.

TECHNICAL FIELD

The present disclosure relates to an optoelectronic device and a method for producing an optoelectronic device.

BACKGROUND

An optoelectronic device (e.g. an organic light emitting diode (OLED), for example a white organic light emitting diode (WOLED), a solar cell, etc.) on an organic basis is usually distinguished by its mechanical flexibility and moderate production conditions. Compared with a device composed of inorganic materials, an optoelectronic device on an organic basis can be produced potentially cost-effectively on account of the possibility of large-area production methods (e.g. roll-to-roll production methods).

A WOLED consists e.g. of an anode and a cathode with a functional layer system therebetween. The functional layer system consists of one or a plurality of emitter layer/s, in which the light is generated, one or a plurality of charge generating layer structure/s each composed of two or more charge generating layers (CGL) for generating charge carriers, and one or a plurality of electron blocking layers, also designated as hole transport layer(s) (HTL), and one or a plurality of hole blocking layers, also designated as electron transport layer(s) (ETL), in order to direct the current flow.

In the simplest embodiment, the charge generating layer structure conventionally consists of a hole-conducting charge generating layer and an electron-conducting charge generating layer, which are directly connected to one another, with the result that illustratively a pn junction is formed. In the pn junction, a depletion region is formed, in which electrons of the hole-conducting charge generating layer migrate into the electron-conducting charge generating layer, wherein the electron-conducting charge generating layer is an n-doped charge generating layer. As a result of a voltage being applied to the pn junction in the reverse direction, in the depletion region electrons and holes are generated which migrate into the emitter layers and can generate electromagnetic radiation as a result of recombination (e.g. light).

An OLED can be produced with good efficiency and lifetime by means of conductivity doping by the use of a p-i-n (p-doped-intrinsic-n-doped) junction analogously to the conventional inorganic LED. In this case, the charge carriers from the p-doped and respectively n-doped layers are injected in a specific manner into the intrinsic layer, in which the excitons, i.e. electron-hole pairs, are formed.

By stacking one or a plurality of intrinsic layers one above another, it is possible to obtain in the OLED, with practically the same efficiency and identical luminance, significantly longer lifetimes compared with an OLED including only one intrinsic layer. For the same current density, double to triple the luminance can thus be realized. For the stacking one above another, charge generating layers consisting of a highly doped pn junction are required.

The hole-conducting and electron-conducting charge generating layers can each consist of one or a plurality of organic and/or inorganic substance(s). In the production of the charge generating layer, the respective matrix is usually admixed with one or a plurality of organic or inorganic substances (dopants) in order to increase the conductivity of the matrix. This doping can produce electrons (n-doped; dopants e.g. metals having a low work function, e.g. Na, Ca, Cs, Li, Mg or compounds thereof e.g. $Cs_2CO_3$, $Cs_3PO_4$, or organic dopants from the company NOVALED, e.g. NDN-1, NDN-26) or holes (p-doped; dopant e.g. transition metal oxides, e.g. $MoO_x$, $WO_x$, $VO_x$, organic compounds, e.g. Cu(I)pFBz, F4-TCNQ, or organic dopants from the company NOVALED, e.g. NDP-2, NDP-9) as charge carriers in the matrix.

The use of a CGL in an optoelectronic device presupposes a simple construction, i.e. as few layers as possible, which are as easy as possible to produce. Furthermore, a small voltage drop across the CGL and the highest possible transmission of the CGL layers are necessary, i.e. the lowest possible absorption losses in the spectral range, of the electromagnetic radiation emitted by the OLED.

In a manner similar to inorganic layers at high temperatures in the manufacture of semiconductor devices, for example at temperatures of greater than 200° C., during manufacture and during operation even at temperatures of less than 100° C. material of the organic layers can diffuse into other layers (partial layer interdiffusion), e.g. parts of the n-doped charge generating layer into the p-doped charge generating layer of a charge generating layer structure in an OLED.

When an electric field is applied to the charge generating layer structure, a voltage drop across this layer structure is measurable by means of the layer interdiffusion. Said voltage drop increases with the operating period, since the diffusion of conductive organic substances is directed in an electric field. This can limit the life of the operating period of organic optoelectronic devices.

In order to suppress the partial layer interdiffusion (barrier effect), an interlayer can be inserted between the individual organic layers. In this case, the interlayer prevents the layer interdiffusion, for example of the dopant or of the matrix substance. Furthermore, the interlayer can prevent a reaction of the first electron-conducting charge generating layer with the second electron-conducting charge generating layer, i.e. the interlayer forms a reaction barrier. Furthermore, the interlayer can reduce the interfacial roughness between the hole-conducting charge generating layer and the electron-conducting charge generating layer by the surface roughness of the electron-conducting charge generating layer being reduced or compensated for by means of the interlayer.

However, the interlayer constitutes an optoelectronic resistance in the charge generating layer structure and can reduce the efficiency of the optoelectronic device. The optoelectronic resistance of a layer, in various embodiments, can be understood to mean an absorption of electromagnetic radiation, for example light, in the layer and an electrical resistance, for example as a result of a voltage drop across said layer.

SUMMARY

In various embodiments an optoelectronic device is provided. The optoelectronic device may include a first organic functional layer structure, a second organic functional layer structure, and a charge generating layer structure between the first organic functional layer structure and the second organic functional layer structure. The charge generating layer structure may include a first electron-conducting charge generating layer, a second electron-conducting charge generating layer, and an interlayer between first electron-conducting charge generating layer, and second electron-conducting charge generating layer, wherein the interlayer includes at least one phthalocyanine derivative.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various aspects are described with reference to the following drawings, in which.

DESCRIPTION

Figure 1:
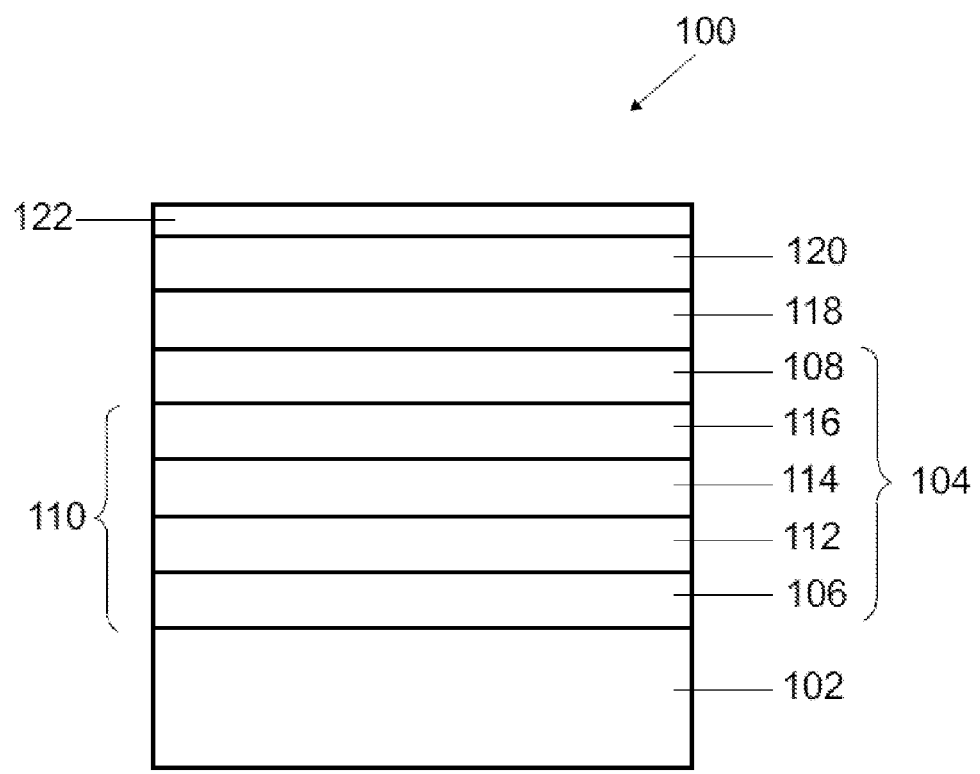
FIG. 1 shows a cross-sectional view of an optoelectronic device in accordance with various exemplary embodiments.

The following detailed description refers to the accompanying drawings that show, by way of illustration, specific details and aspects of this disclosure in which the invention may be practiced. Other aspects may be utilized and structural, logical, and electrical changes may be made without departing from the scope of the invention. The various aspects of this disclosure are not necessarily mutually exclusive, as some aspects of this disclosure can be combined with one or more other aspects of this disclosure to form new aspects.

In various exemplary embodiments, an optoelectronic device may be formed as a light emitting device, for example as an organic light emitting diode (OLED) or as an organic light emitting transistor. In various exemplary embodiments, the optoelectronic device may be part of an integrated circuit. Furthermore, a plurality of light emitting devices may be provided, for example in a manner accommodated in a common housing. In various exemplary embodiments, the optoelectronic device may also be formed as a solar cell. Even though the various exemplary embodiments are described below on the basis of an OLED, these exemplary embodiments may, however, readily also be applied to the other optoelectronic devices mentioned above.

In the context of this description, an organic substance may be understood to mean a carbon compound which, regardless of the respective state of matter, is present in chemically uniform form and is characterized by characteristic physical and chemical properties. Furthermore, in the context of this description, an inorganic substance may be understood to mean a compound which, regardless of the respective state of matter, is present in chemically uniform form and is characterized by characteristic physical and chemical properties, without carbon or a simple carbon compound, e.g. $CO_2$. In the context of this description, an organic-inorganic substance (hybrid substance) may be understood to mean a compound which, regardless of the respective state of matter, is present in chemically uniform form and is characterized by characteristic physical and chemical properties, including compound portions which contain carbon and are free of carbon. In the context of this description, the term "substance" encompasses all abovementioned substances, for example an organic substance, an inorganic substance, and/or a hybrid substance. Furthermore, in the context of this description, a substance mixture may be understood to mean something which has constituents consisting of two or more different substances, the constituents of which are very finely dispersed, for example.

In various embodiments, an electron-conducting layer of an electronic device may be understood to mean a layer in which the chemical potential of the substance or of the substance mixture of the layer is energetically closer to the conduction band and to the valence band, and in which more than half of the freely mobile charge carriers are electrons. Alternatively or in addition, an electron-conducting layer of an electronic device may be understood to mean a layer in which the mobility of electrons is larger than the mobility of holes.

In various embodiments, a hole-conducting layer of an electronic device may be understood to mean a layer in which the chemical potential of the substance or of the substance mixture of the layer is energetically closer to the valence band than to the conduction band and in which more than half of the freely mobile charge carriers are holes, i.e. free orbital sites for electrons. Alternatively or in addition, a hole-conducting layer of an electronic device may be understood to mean a layer in which the mobility of holes is larger than the mobility of electrons.

In various embodiments, an optoelectronic device and a method for producing it are provided, the optoelectronic device including a first intrinsically electron-conducting charge generating layer and an interlayer having a lower optoelectronic resistance.

A hole-conducting charge generating layer may include an intrinsically hole-conducting substance, wherein the hole-conducting charge generating layer is embodied as a hole transport layer and is in physical contact with the first electron-conducting charge generating layer. Alternatively or in other words, a hole-conducting charge generating layer may include an intrinsically hole-conducting substance, wherein the hole-conducting charge generating layer is embodied as a hole transport layer as part of the second organic functional layer structure and is in physical contact with the first electron-conducting charge generating layer. Charge carrier pairs may be generated at the common interface of the first charge generating layer with the hole transport layer or hole-conducting charge generating layer.

The hole-conducting charge generating layer or hole transport layer may include or be formed from a substance from the group of the following substances: NPB (N,N'-bis(naphthalen-1-yl)-N,N'-bis(phenyl)-benzidine); beta-NPB N,N'-bis(naphthalen-2-yl)-N,N'-bis(phenyl)-benzidine); TPD (N,N'-bis(3-methylphenyl)-N,N'-bis(phenyl)-benzidine); spiro TPD (N,N'-bis(3-methylphenyl)-N,N'-bis(phenyl)-benzidine); spiro-NPB (N,N'-bis(naphthalen-1-yl)-N,N'-bis(phenyl)-spiro); DMFL-TPD N,N'-bis(3-methylphenyl)-N,N'-bis(phenyl)-9,9-dimethyl-fluorene); DMFL-NPB (N,N'-bis(naphthalen-1-yl)-N,N'-bis(phenyl)-9,9-dimethyl-fluorene); DPFL-TPD (N,N'-bis(3-methylphenyl)-N,N'-bis(phenyl)-9,9-diphenyl-fluorene); DPFL-NPB (N,N'-bis(naphthalen-1-yl)-N,N'-bis(phenyl)-9,9-diphenyl-fluorene);

spiro-TAD (2,2',7,7'-tetrakis(N,N-diphenylamino)-9,9'-spirobifluorene); 9,9-bis[4-(N,N-bis-biphenyl-4-yl-amino)phenyl]-9H-fluorene; 9,9-bis[4-(N,N-bis-naphthalen-2-yl-amino)phenyl]-9H-fluorene; 9,9-bis[4-(N,N'-bis-naphthalen-2-yl-N,N'-bis-phenyl-amino)-phenyl]-9H-fluorene; N,N'-bis(phenanthren-9-yl)-N,N'-bis(phenyl)-benzidine; 2,7-bis[N,N-bis(9,9-spiro-bifluoren-2-yl)-amino]-9,9-spiro-bifluorene; 2,2'-bis[N,N-bis(biphenyl-4-yl)amino]9,9-spiro-bifluorene; 2,2'-bis(N,N-di-phenyl-amino)9,9-spiro-bifluorene; di-[4-(N,N-ditolyl-amino)-phenyl]cyclohexane; 2,2',7,7'-tetra(N,N-di-tolyl)amino-spiro-bifluorene; and N,N,N',N'-tetra-naphthalen-2-yl-benzidine.

In various embodiments, the hole transport layer or the hole-conducting charge generating layer may be formed from a substance mixture composed of matrix and p-dopant.

The matrix of the hole transport layer or of the hole-conducting charge generating layer may be a substance selected from the group of substances consisting of: NPB (N,N'-bis(naphthalen-1-yl)-N,N'-bis(phenyl)-benzidine); beta-NPB N,N'-bis(naphthalen-2-yl)-N,N'-bis(phenyl)-benzidine); TPD (N,N'-bis(3-methylphenyl)-N,N'-bis(phenyl)-benzidine); spiro TPD (N,N'-bis(3-methylphenyl)-N,N'-bis(phenyl)-benzidine); spiro-NPB (N,N'-bis(naphthalen-1-yl)-N,N'-bis(phenyl)-spiro); DMFL-TPD N,N'-bis(3-methylphenyl)-N,N'-bis(phenyl)-9,9-dimethyl-fluorene); DMFL-NPB (N,N'-bis(naphthalen-1-yl)-N,N'-bis(phenyl)-9,9-dimethyl-fluorene); DPFL-TPD (N,N'-bis(3-methylphenyl)-N,N'-bis(phenyl)-9,9-diphenyl-fluorene); DPFL-NPB (N,N'-bis(naphthalen-1-yl)-N,N'-bis(phenyl)-9,9-diphenyl-fluorene); spiro-TAD (2,2',7,7'-tetrakis(N,N-diphenylamino)-9,9'-spirobifluorene); 9,9-bis[4-(N,N-bis-biphenyl-4-yl-amino)phenyl]-9H-fluorene; 9,9-bis[4-(N,N-bis-naphthalen-2-yl-amino)phenyl]-9H-fluorene; 9,9-bis[4-(N,N'-bis-naphthalen-2-yl-N,N'-bis-phenyl-amino)-phenyl]-9H-fluorene; N,N'-bis(phenanthren-9-yl)-N,N'-bis(phenyl)-benzidine; 2,7-bis[N,N-bis(9,9-spiro-bifluoren-2-yl)-amino]-9,9-spiro-bifluorene; 2,2'-bis[N,N-bis(biphenyl-4-yl)amino]9,9-spiro-bifluorene; 2,2'-bis(N,N-di-phenyl-amino)9,9-spiro-bifluorene; di-[4-(N,N-ditolyl-amino)-phenyl]cyclohexane; 2,2',7,7'-tetra(N,N-di-tolyl)amino-spiro-bifluorene; and N,N,N',N'-tetra-naphthalen-2-yl-benzidine.

The dopant of the hole-conducting charge generating layer or hole transport layer may be a substance selected from the group of substances consisting of: HAT-(CN)6, Cu(I)pFBz, $MoO_x$, $WO_x$, $VO_x$, $ReO_x$, F4-TCNQ, NDP-2, NDP-9, Bi(III) pFBz, F16CuPc.

The hole-conducting charge generating layer may have a layer thickness in a range of approximately 1 nm to approximately 500 nm.

In various embodiments, the first electron-conducting charge generating layer may include an intrinsically electron-conducting substance.

The first intrinsically electron-conducting charge generating layer may include a substance from the group of the following substances: HAT-(CN)6, Cu(I)pFBz, $MoO_x$, $WO_x$, $VO_x$, $ReO_x$, F4-TCNQ; NDP-2, NDP 9 from the company NOVALED; Bi(III)pFBz, F16CuPc.

The substance of the first electron-conducting charge generating layer may have a transmission of greater than approximately 90% in a wavelength range of approximately 450 nm to approximately 650 nm.

The first electron-conducting charge generating layer may have a layer thickness in a range of approximately 1 nm to approximately 500 nm.

The second electron-conducting charge generating layer may include an intrinsically electron-conducting substance.

The substance of the second intrinsically electron-conducting charge generating layer may be a substance selected from the group of substances consisting of: NDN-26 from the company NOVALED, MgAg, $Cs_2CO_3$, $Cs_3PO_4$, Na, Ca, K, Mg, Cs, Li, LiF.

The second electron-conducting charge generating layer may be formed from a substance mixture composed of matrix and n-type dopant.

The matrix of the second electron-conducting charge generating layer may be a substance selected from the group of substances consisting of: NET-18 from the company NOVALED; 2,2',2"-(1,3,5-benzinetriyl)-tris(1-phenyl-1-H-benzimidazole); 2-(4-biphenylyl)-5-(4-tert-butylphenyl)-1,3,4-oxadiazole, 2,9-dimethyl-4,7-diphenyl-1,10-phenanthroline (BCP); 8-hydroxyquinolinolato-lithium, 4-(naphthalen-1-yl)-3,5-diphenyl-4H-1,2,4-triazole; 1,3-bis[2-(2,2'-bipyridin-6-yl)-1,3,4-oxadiazo-5-yl]benzene; 4,7-diphenyl-1,10-phenanthroline (Bphen); 3-(4-biphenylyl)-4-phenyl-5-tert-butylphenyl-1,2,4-triazole; bis(2-methyl-8-quinolinolate)-4-(phenylphenolato)aluminum; 6,6'-bis[5-(biphenyl-4-yl)-1,3,4-oxadiazo-2-yl]-2,2'-bipyridyl; 2-phenyl-9,10-di(naphthalen-2-yl)-anthracene; 2,7-bis[2-(2,2'-bipyridin-6-yl)-1,3,4-oxadiazo-5-yl]-9,9-dimethylfluorene; 1,3-bis[2-(4-tert-butylphenyl)-1,3,4-oxadiazo-5-yl]benzene; 2-(naphthalen-2-yl)-4,7-diphenyl-1,10-phenanthroline; 2,9-bis(naphthalen-2-yl)-4,7-diphenyl-1,10-phenanthroline; tris(2,4,6-trimethyl-3-(pyridin-3-yl)phenyl)borane; 1-methyl-2-(4-(naphthalen-2-yl)phenyl)-1H-imidazo[4,5-f][1,10] phenanthroline; phenyl-dipyrenylphosphine oxide; naphthalenetetracarboxylic dianhydride or the imides thereof; perylenetetracarboxylic dianhydride or the imides thereof; and substances based on silols including a silacyclopentadiene unit.

The dopant of the electron-conducting charge generating layer may be a substance selected from the group of substances consisting of: NDN-26 from the company NOVALED, MgAg, $Cs_2CO_3$, $Cs_3PO_4$, Na, Ca, K, Mg, Cs, Li, LiF.

The second electron-conducting charge generating layer may have a layer thickness in a range of approximately 1 nm to approximately 500 nm.

The conduction band of the substance or substance mixture of the first electron-conducting charge generating layer may be energetically approximately equal to the valence band of the substance or substance mixture of the hole-conducting charge generating layer. Alternatively or in addition, the conduction band of the substance or substance mixture of the first electron-conducting charge generating layer may be approximately equal to the valence band of the substance or substance mixture of the second electron-conducting charge generating layer.

In various embodiments, the interlayer may include an inorganic substance. In various embodiments, the interlayer may include or be formed from an organic substance. In various embodiments, the interlayer may be formed from an organic-inorganic hybrid substance. The interlayer may include a substance mixture composed of two or more substances, wherein the substances are selected from a group consisting of an inorganic substance, an organic substance and an organic-inorganic hybrid substance.

In various embodiments, the interlayer may include the same substance or the same substance mixture as the substance or the substance mixture of the first electron-conducting charge generating layer, wherein however the substance or the substance mixture may have a different physical structure in the interlayer than in the first electron-conducting charge generating layer.

In various embodiments, the interlayer may include the same substance or the same substance mixture as the substance or the substance mixture of the second electron-conducting charge generating layer, wherein however the substance or the substance mixture may have a different physical structure in the interlayer than in the second electron-conducting charge generating layer.

The mentioned physical structure may include at least one of the following parameters: the density of the substance or of the substance mixture; the crystallinity of the substance or of the substance mixture; the crystal orientation of the substance or of the substance mixture; and/or the local doping density of the substance or of the substance mixture.

In various embodiments, the interlayer may have a heterogeneous layer cross section. The heterogeneous layer cross section may include regions of different crystallinity of the substance or of the substance mixture. The different heterogeneous regions may be partial or complete crystallizations in an amorphous portion of the substance or of the substance mixture of the interlayer.

Alternatively or in addition, the heterogeneous layer cross section may include regions of different crystal orientation of the substance or of the substance mixture. The barrier effect of the interlayer may be increased by an at least local orientation of the molecules of the interlayer, for example if the longest crystal axis of the crystallized regions is oriented parallel to at least one interface of the first electron-conducting and second electron-conducting charge generating layers connected by the interlayer. Alternatively or in addition, the longest crystal axis of the crystallized substance or of the crystallized substance mixture of the interlayer may be oriented parallel to the interface of the interlayer with the second electron-conducting charge generating layer. Alternatively or in addition, the longest crystal axis of the crystallized substance or of the crystallized substance mixture of the interlayer may be oriented parallel to the interface of the interlayer with the first electron-conducting charge generating layer.

Alternatively or in addition, the heterogeneous layer cross section of the interlayer may include two or more layers each composed of a substance of the substance mixture of the interlayer or different physical structures of the substance of the interlayer.

In various embodiments, the physical layer distinction may include at least one of the following parameters: the density of the substance or of the substance mixture; the crystallinity of the substance or of the substance mixture; the crystal orientation of the substance or of the substance mixture; and/or the local doping density of the substance or of the substance mixture.

In various embodiments, the interlayer may have a layer thickness of approximately 1 nm to approximately 200 nm.

In various embodiments, the common interface of the interlayer with the first electron-conducting charge generating layer may have plane-parallelism with respect to the common interface of the interlayer with the second electron-conducting charge generating layer.

In various embodiments, the interlayer may be formed from an electrically insulating substance or substance mixture and the valence band of the interlayer may be energetically above the conduction band of the physically connected first electron-conducting charge generating layer and above the valence band of the physically connected second electron-conducting charge generating layer, i.e. the charge carrier conduction takes place by means of a tunneling current.

In various embodiments, the interlayer should influence the optoelectronic efficiency of the optoelectronic device by up to a maximum of approximately 10% in a wavelength range of approximately 450 nm to approximately 650 nm.

In various embodiments, the interlayer may have a transmission of greater than approximately 90% in the wavelength range of approximately 450 nm to approximately 650 nm.

In various embodiments, the layer cross section of the interlayer may be structurally stable up to a temperature of up to approximately 120° C.

In various embodiments, the at least one phthalocyanine derivative may include or consist of at least one metal phthalocyanine derivative or a metal oxide phthalocyanine derivative or unsubstituted phthalocyanine ($H_2Pc$).

In various embodiments, the phthalocyanine, e.g. the metal oxide phthalocyanine, may be selected from the group of phthalocyanines consisting of: vanadium oxide phthalocyanine (VOPc), titanium oxide phthalocyanine (TiOPc), copper phthalocyanine (CuPc), unsubstituted phthalocyanine, cobalt phthalocyanine (CoPc), aluminum phthalocyanine (AlPc), nickel phthalocyanine (NiPc), iron phthalocyanine (FePc), zinc phthalocyanine (ZnPc) or manganese phthalocyanine (MnPC).

In various embodiments, the optoelectronic device may be designed as an organic light emitting diode.

In various aspects, a method for producing an optoelectronic device is provided, wherein the method includes: forming a first organic functional layer structure, forming a charge generating layer structure above or on the first organic functional layer structure, and forming a second organic functional layer structure above or on the charge generating layer structure, wherein forming the charge generating layer structure includes: forming a second electron-conducting charge generating layer, forming an interlayer above or on the second electron-conducting charge generating layer, wherein the interlayer includes at least one phthalocyanine derivative, and forming a first electron-conducting charge generating layer above or on the interlayer.

In one embodiment of the method, the first electron-conducting charge generating layer may be formed from an intrinsically electron-conducting substance.

The first intrinsically electron-conducting charge generating layer may be formed from a substance from the group of the following substances: HAT-(CN)6, Cu(I)pFBz, $MoO_x$, $WO_x$, $VO_x$, $ReO_x$, F4-TCNQ, NDP-2, NDP-9, Bi(III)pFBz, F16CuPc.

In various embodiments of the method, the hole-conducting charge generating layer or hole transport layer may be formed from an intrinsically hole-conducting substance, wherein the hole-conducting charge generating layer or hole transport layer is part of the second organic functional layer structure and charge carrier pairs are generated and separated at the common interface of the hole-conducting charge generating layer and the first electron-conducting charge generating layer.

In various embodiments of the method, the hole-conducting charge generating layer may be formed from a substance from the group of the following substances: NPB (N,N'-bis(naphthalen-1-yl)-N,N'-bis(phenyl)-benzidine); beta-NPB N,N'-bis(naphthalen-2-yl)-N,N'-bis(phenyl)-benzidine); TPD (N,N'-bis(3-methylphenyl)-N,N'-bis(phenyl)-benzidine); spiro TPD (N,N'-bis(3-methylphenyl)-N,N'-bis(phenyl)-benzidine); spiro-NPB (N,N'-bis(naphthalen-1-yl)-N,N'-bis(phenyl)-spiro); DMFL-TPD N,N'-bis(3-methylphenyl)-N,N'-bis(phenyl)-9,9-dimethyl-fluorene); DMFL-NPB (N,N'-bis(naphthalen-1-yl)-N,N'-bis(phenyl)-9,9-dimethyl-fluorene); DPFL-TPD (N,N'-bis(3-methylphenyl)-N,N'-bis(phenyl)-9,9-diphenyl-fluorene); DPFL-NPB (N,N'-bis(naphthalen-1-yl)-N,N'-bis(phenyl)-9,9-diphenyl-fluorene); spiro-TAD (2,2',7,7'-tetrakis(N,N-diphenyl-amino)-9,9'-spirobifluorene); 9,9-bis[4-(N,N-bis-biphenyl-4-yl-amino)phenyl]-9H-fluorene; 9,9-bis[4-(N,N-bis-naphthalen-2-yl-amino)phenyl]-9H-fluorene; 9,9-bis[4-(N, N'-bis-naphthalen-2-yl-N,N'-bis-phenyl-amino)-phenyl]-9H-fluorene; N,N'-bis(phenanthren-9-yl)-N,N'-bis(phenyl)-benzidine; 2,7-bis[N,N-bis(9,9-spiro-bifluoren-2-yl)-amino]-9,9-spiro-bifluorene; 2,2'-bis[N,N-bis(biphenyl-4-yl)amino]9,9-spiro-bifluorene; 2,2'-bis(N,N-di-phenyl-amino)9,9-spiro-bifluorene; di-[4-(N,N-ditolyl-amino)-phenyl]cyclohexane; 2,2',7,7'-tetra(N,N-di-tolyl)amino-spiro-bifluorene; and N,N,N',N'-tetra-naphthalen-2-yl-benzidine.

In various embodiments of the method, the hole-conducting charge generating layer may be formed from a substance mixture composed of matrix and p-type dopant.

The matrix of the hole-conducting charge generating layer may include a substance selected from the group of substances consisting of: NPB (N,N'-bis(naphthalen-1-yl)-N,N'-bis(phenyl)-benzidine); beta-NPB N,N'-bis(naphthalen-2-yl)-N,N'-bis(phenyl)-benzidine); TPD (N,N'-bis(3-methylphenyl)-N,N'-bis(phenyl)-benzidine); spiro TPD (N,N'-bis(3-methylphenyl)-N,N'-bis(phenyl)-benzidine); spiro-NPB (N,N'-bis(naphthalen-1-yl)-N,N'-bis(phenyl)-spiro); DMFL-TPD N,N'-bis(3-methylphenyl)-N,N'-bis(phenyl)-9,9-dimethyl-fluorene); DMFL-NPB (N,N'-bis(naphthalen-1-yl)-N,N'-bis(phenyl)-9,9-dimethyl-fluorene); DPFL-TPD (N,N'-bis(3-methylphenyl)-N,N'-bis(phenyl)-9,9-diphenyl-fluorene); DPFL-NPB (N,N'-bis(naphthalen-1-yl)-N,N'-bis(phenyl)-9,9-diphenyl-fluorene); spiro-TAD (2,2',7,7'-tetrakis(N,N-diphenylamino)-9,9'-spirobifluorene); 9,9-bis[4-(N,N-bis-biphenyl-4-yl-amino)phenyl]-9H-fluorene; 9,9-bis[4-(N,N-bis-naphthalen-2-yl-amino)phenyl]-9H-fluorene; 9,9-bis[4-(N,N'-bis-naphthalen-2-yl-N,N'-bis-phenyl-amino)-phenyl]-9H-fluorene; N,N'-bis (phenanthren-9-yl)-N,N'-bis(phenyl)-benzidine; 2,7-bis[N,N-bis(9,9-spiro-bifluoren-2-yl)-amino]-9,9-spiro-bifluorene; 2,2'-bis[N,N-bis(biphenyl-4-yl)amino]9,9-spiro-bifluorene; 2,2'-bis(N,N-di-phenyl-amino)9,9-spiro-bifluorene; di-[4-(N,N-ditolyl-amino)-phenyl]cyclohexane; 2,2',7,7'-tetra(N,N-di-tolyl)amino-spiro-bifluorene; and N,N,N',N'-tetra-naphthalen-2-yl-benzidine.

The dopant of the hole-conducting charge generating layer may include a substance from the group of substances consisting of: HAT-(CN)6, Cu(I)pFBz, $MoO_x$, $WO_x$, $VO_x$, $ReO_x$, F4-TCNQ; NDP-2, NDP-9 from the company NOVALED; Bi(III)pFBz, F16CuPc.

In various embodiments of the method, the hole-conducting charge generating layer may be formed with a layer thickness in a range of approximately 1 nm to approximately 500 nm.

In various embodiments of the method, the substance of the first electron-conducting charge generating layer may be formed from an intrinsically electron-conducting substance.

The substance of the first intrinsically electron-conducting charge generating layer may include or be formed from a substance from the group of the following substances: HAT-(CN)6, Cu(I)pFBz, $MoO_x$, $WO_x$, $VO_x$, $ReO_x$, F4-TCNQ, NDP-2, NDP-9 from the company NOVALED, Bi(III)pFBz, F16CuPc.

In various embodiments of the method, the substance of the first electron-conducting charge generating layer may have a transmission of greater than approximately 90% in a wavelength range of approximately 450 nm to approximately 650 nm.

In various embodiments of the method, the first electron-conducting charge generating layer may be formed with a layer thickness in a range of approximately 1 nm to approximately 500 nm.

In various embodiments of the method, the second electron-conducting charge generating layer may be formed from an intrinsically electron-conducting substance.

The substance of the intrinsically electron-conducting charge generating layer may be a substance from the group of substances consisting of: NDN-26 from the company NOVALED, MgAg, $Cs_2CO_3$, $Cs_3PO_4$, Na, Ca, K, Mg, Cs, Li, LiF.

In various embodiments of the method, the second electron-conducting charge generating layer may be formed from a substance mixture composed of matrix and n-type dopant.

The matrix of the second electron-conducting charge generating layer may be a substance from the group of substances consisting of: 2,2',2''-(1,3,5-benzinetriyl)-tris(1-phenyl-1-H-benzimidazole); 2-(4-biphenylyl)-5-(4-tert-butylphenyl)-1, 3,4-oxadiazole, 2,9-dimethyl-4,7-diphenyl-1,10-phenanthroline (BCP); 8-hydroxyquinolinolato-lithium, 4-(naphthalen-1-yl)-3,5-diphenyl-4H-1,2,4-triazole; 1,3-bis [2-(2,2'-bipyridin-6-yl)-1,3,4-oxadiazo-5-yl]benzene; 4,7-diphenyl-1,10-phenanthroline (Bphen); 3-(4-biphenylyl)-4-phenyl-5-tert-butylphenyl-1,2,4-triazole; bis(2-methyl-8-quinolinolate)-4-(phenylphenolato)aluminum; 6,6'-bis[5-(biphenyl-4-yl)-1,3,4-oxadiazo-2-yl]-2,2'-bipyridyl; 2-phenyl-9,10-di(naphthalen-2-yl)-anthracene; 2,7-bis[2-(2, 2'-bipyridin-6-yl)-1,3,4-oxadiazo-5-yl]-9,9-dimethylfluorene; 1,3-bis[2-(4-tert-butylphenyl)-1,3,4-oxadiazo-5-yl] benzene; 2-(naphthalen-2-yl)-4,7-diphenyl-1,10-phenanthroline; 2,9-bis(naphthalen-2-yl)-4,7-diphenyl-1,10-phenanthroline; tris(2,4,6-trimethyl-3-(pyridin-3-yl)phenyl) borane; 1-methyl-2-(4-(naphthalen-2-yl)phenyl)-1H-imidazo[4,5-f][1,10]phenanthroline; phenyl-dipyrenylphosphine oxide; naphthalenetetracarboxylic dianhydride or the imides thereof; perylenetetracarboxylic dianhydride or the imides thereof; and substances based on silols including a silacyclopentadiene unit.

The dopant of the second electron-conducting charge generating layer may be a substance from the group of substances consisting of: NDN-26 from the company NOVALED, MgAg, $Cs_2CO_3$, $Cs_3PO_4$, Na, Ca, K, Mg, Cs, Li, LiF.

In various embodiments of the method, the second electron-conducting charge generating layer may be formed with a layer thickness in a range of approximately 1 nm to approximately 500 nm.

In various embodiments of the method, the first electron-conducting charge generating layer may be formed such that the conduction band of the substance or substance mixture of the first electron-conducting charge generating layer is energetically approximately equal to the valence band of the substance or substance mixture of the hole-conducting charge generating layer in physical contact and energetically approximately equal to the valence band of the substance or substance mixture of the second electron-conducting charge generating layer.

In various embodiments of the method, the interlayer may be formed from an inorganic substance. Alternatively or in addition, the interlayer may include or be formed from an organic substance. Alternatively or in addition, the interlayer may be formed from an organic-inorganic hybrid substance. In various embodiments of the method, the interlayer may be formed from a substance mixture composed of two or more substances, wherein the substances may be selected from the group consisting of: an inorganic substance, an organic substance and an organic-inorganic hybrid substance.

In various embodiments of the method, the interlayer may be formed from the same substance or the same substance mixture as the substance or the substance mixture of the first electron-conducting charge generating layer, wherein however the substance or the substance mixture has a different physical structure in the interlayer than in the first electron-conducting charge generating layer.

In various embodiments of the method, the interlayer may include or be formed from the same substance or the same substance mixture as the substance or the substance mixture of the second electron-conducting charge generating layer, wherein however the substance or the substance mixture has a different physical structure in the interlayer than in the second electron-conducting charge generating layer.

The mentioned physical structure of the interlayer may include at least one of the following parameters: the density of the substance or of the substance mixture; the crystallinity of the substance or of the substance mixture; the crystal orientation of the substance or of the substance mixture; and/or the local doping density of the substance or of the substance mixture.

The crystallinity may be understood as crystal form. Alternatively or in addition, the crystallinity may be understood as the rate of crystallinity.

In various embodiments of the method, the interlayer may be formed having a heterogeneous layer cross section. The heterogeneous layer cross section may be formed by regions of different crystallinity of the substance or of the substance mixture. Alternatively or in addition, the heterogeneous layer cross section may be formed by regions of different crystal orientation of the substance or substance mixture. The crystallinity and/or crystal orientation of the substance of the interlayer may be set by means of process parameters. The process parameters may include at least one of the following parameters: presence and alignment of electromagnetic fields; formation of nucleation nuclei on the electron-conducting layer before the formation of the interlayer.

In various embodiments of the method, the interlayer may be formed such that the longest crystal axis of the crystallized substance or of the crystallized substance mixture of the interlayer may be oriented parallel to the interface of the interlayer with the second electron-conducting charge generating layer.

In various embodiments of the method, the longest crystal axis of the crystallized substance or substance mixture of the interlayer may be oriented parallel to the interface of the interlayer with the first electron-conducting charge generating layer.

In various embodiments of the method, the heterogeneous layer cross section of the interlayer may include two or more layers each composed of a substance of the substance mixture of the interlayer or different physical structures of the substance of the interlayer.

The distinction of the physical structure may include at least one of the following parameters: the density of the substance or of the substance mixture; the crystallinity of the substance or of the substance mixture; the crystal orientation of the substance or of the substance mixture; and/or the local doping density of the substance or of the substance mixture.

In various embodiments of the method, the interlayer may be formed with a layer thickness of approximately 1 nm to approximately 200 nm.

In various embodiments of the method, the common interface of the interlayer with the first electron-conducting charge generating layer may have plane-parallelism with respect to the common interface of the interlayer with the second electron-conducting charge generating layer.

In various embodiments of the method, the interlayer may be formed from an electrically insulating substance or substance mixture and the valence band of the interlayer may be energetically above the conduction band of the physically connected first electron-conducting charge generating layer and above the valence band of the physically connected second electron-conducting charge generating layer.

In various embodiments of the method, the interlayer should influence the optoelectronic efficiency of the optoelectronic device by up to a maximum of approximately 10% in a wavelength range of approximately 450 nm to approximately 650 nm.

In various embodiments of the method, the interlayer may have a transmission of greater than approximately 90% in the wavelength range of approximately 450 nm to approximately 650 nm.

In various embodiments of the method, the interlayer may be formed such that the layer cross section of the interlayer is structurally stable up to a temperature of up to approximately 120° C.

In various embodiments of the method, the interlayer may be formed from the at least one phthalocyanine derivative, at least one metal phthalocyanine derivative or metal oxide phthalocyanine derivative or unsubstituted phthalocyanine derivative.

In various embodiments of the method, the interlayer may be formed from a phthalocyanine from the group of phthalocyanines consisting of: vanadium oxide phthalocyanine (VOPc), titanium oxide phthalocyanine (TiOPc), copper phthalocyanine (CuPc), unsubstituted phthalocyanine ($H_2Pc$), cobalt phthalocyanine (CoPc), aluminum phthalocyanine (AlPc), nickel phthalocyanine (NiPc), iron phthalocyanine (FePc), zinc phthalocyanine (ZnPc) or manganese phthalocyanine (MnPC).

In various embodiments of the method, the method may furthermore include: forming an electron conductor layer; forming the second electron-conducting charge generating layer on or above the electron conductor layer; forming a hole conductor layer on or above the first electron-conducting charge generating layer; forming a hole conductor layer on or above the first electron-conducting charge generating layer.

In various embodiments of the method, the method may furthermore include: forming a first electrode; forming the first organic functional layer structure on or above the first electrode; and forming a second electrode on or above the second organic functional layer structure.

In various embodiments of the method, the optoelectronic device may be produced as an organic light emitting diode.

In the following detailed description, reference is made to the accompanying drawings, which form part of this description and show for illustration purposes specific embodiments in which the invention may be implemented. In this regard, direction terminology such as, for instance, "at the top", "at the bottom", "at the front", "at the back", "front", "rear", etc. is used with respect to the orientation of the figure(s) described. Since device parts of embodiments may be positioned in a number of different orientations, the direction terminology serves for illustration and is not restrictive in any way whatsoever. It goes without saying that other embodiments may be used and structural or logical changes may be made, without departing from the scope of protection of the present invention. It goes without saying that the features of the various exemplary embodiments described herein may be combined with one another, unless specifically indicated otherwise. Therefore, the following detailed description should not be interpreted in a restrictive sense, and the scope of protection of the present invention is defined by the appended claims.

In the context of this description, the terms "connected" and "coupled" are used to describe both a direct and an indirect connection and a direct or indirect coupling. In the figures, identical or similar elements are provided with identical reference signs, insofar as this is expedient.

FIG. 1 shows a cross-sectional view of an optoelectronic device 100 in accordance with various exemplary embodiments.

The optoelectronic device 100 in the form of a light emitting device, for example in the form of an organic light emitting diode 100, may have a substrate 102. The substrate 102 may serve for example as a carrier element for electronic elements or layers, for example light emitting elements. By way of example, the substrate 102 may include or be formed from glass, quartz, and/or a semiconductor material or any other suitable material. Furthermore, the substrate 102 may include or be formed from a plastic film or a laminate including one or including a plurality of plastic films. The plastic may include or be formed from one or more polyolefins (for example high or low density polyethylene (PE) or polypropylene (PP)). Furthermore, the plastic may include or be formed from polyvinyl chloride (PVC), polystyrene (PS), polyester and/or polycarbonate (PC), polyethylene terephthalate (PET), polyether sulfone (PES) and/or polyethylene naphthalate (PEN). The substrate 102 may include one or more of the materials mentioned above. The substrate 102 may be embodied as translucent or even transparent.

In various exemplary embodiments, the term "translucent" or "translucent layer" may be understood to mean that a layer is transmissive to light, for example to the light generated by the light emitting device, for example in one or more wavelength ranges, for example to light in a wavelength range of visible light (for example at least in a partial range of the wavelength range of from 380 nm to 780 nm). By way of example, in various exemplary embodiments, the term "translucent layer" should be understood to mean that substantially the entire quantity of light coupled into a structure (for example a layer) is also coupled out from the structure (for example layer), wherein part of the light may be scattered in this case.

In various exemplary embodiments, the term "transparent" or "transparent layer" may be understood to mean that a layer is transmissive to light (for example at least in a partial range of the wavelength range of from 380 nm to 780 nm), wherein light coupled into a structure (for example a layer) is also coupled out from the structure (for example layer) substantially without scattering or light conversion. Consequently, in various exemplary embodiments, "transparent" should be regarded as a special case of "translucent".

For the case where, for example, a light emitting monochromatic or emission spectrum-limited electronic device is intended to be provided, it suffices for the optically translucent layer structure to be translucent at least in a partial range of the wavelength range of the desired monochromatic light or for the limited emission spectrum.

In various exemplary embodiments, the organic light emitting diode 100 (or else the light emitting devices in accordance with the exemplary embodiments that have been described above or will be described below) may be designed as a so-called top and bottom emitter. A top and bottom emitter may also be designated as an optically transparent device, for example a transparent organic light emitting diode.

In various exemplary embodiments, a barrier layer (not illustrated) may optionally be arranged on or above the substrate 102. The barrier layer may include or consist of one or more of the following materials: aluminum oxide (alumina), zinc oxide, zirconium oxide, titanium oxide, hafnium oxide, tantalum oxide, lanthanum oxide, silicon oxide, silicon nitride, silicon oxynitride, indium tin oxide, indium zinc oxide, aluminum-doped zinc oxide, and mixtures and alloys thereof. Furthermore, in various exemplary embodiments, the barrier layer may have a layer thickness in a range of approximately 0.1 nm (one atomic layer) to approximately 5000 nm, for example a layer thickness in a range of approximately 10 nm to approximately 200 nm, for example a layer thickness of approximately 40 nm.

An electrically active region 104 of the light emitting device 100 may be arranged on or above the barrier layer. The electrically active region 104 may be understood as that region of the light emitting device 100 in which an electric current for the operation of the optoelectronic device, for example of the light emitting device 100, flows. In various exemplary embodiments, the electrically active region 104 may have a first electrode 106, a second electrode 108 and a functional layer system 110, as will be explained in even greater detail below.

In this regard, in various exemplary embodiments, the first electrode 106 (for example in the form of a first electrode layer 106) may be applied on or above the barrier layer (or on or above the substrate 102 if the barrier layer is not present). The first electrode 106 (also designated hereinafter as bottom electrode 106) may be formed from an electrically conductive material, such as, for example, a metal or a transparent conductive oxide (TCO) or a layer stack including a plurality of layers of the same metal or different metals and/or the same TCO or different TCOs. Transparent conductive oxides are transparent conductive materials, for example metal oxides, such as, for example, zinc oxide, tin oxide, cadmium oxide, titanium oxide, indium oxide, or indium tin oxide (ITO). Alongside binary metal-oxygen compounds, such as, for example, $ZnO$, $SnO_2$, or $In_2O_3$, ternary metal-oxygen compounds, such as, for example, $AlZnO$, $Zn_2SnO_4$, $CdSnO_3$, $ZnSnO_3$, $MgIn_2O_4$, $GaInO_3$, $Zn_2In_2O_5$ or $In_4Sn_3O_{12}$, or mixtures of different transparent conductive oxides also belong to the group of TCOs and may be used in various exemplary embodiments. Furthermore, the TCOs do not necessarily correspond to a stoichiometric composition and may furthermore be p-doped or n-doped.

In various exemplary embodiments, the first electrode 106 may include a metal; for example Ag, Pt, Au, Mg, Al, Ba, In, Ca, Sm or Li, and compounds, combinations or alloys of these materials.

In various exemplary embodiments, the first electrode 106 may be formed by a layer stack of a combination of a layer of a metal on a layer of a TCO, or vice versa. One example is a silver layer applied on an indium tin oxide layer (ITO) (Ag on ITO) or ITO-Ag-ITO multilayers.

In various exemplary embodiments, the first electrode 106 may provide one or a plurality of the following materials as an alternative or in addition to the abovementioned materials: networks composed of metallic nanowires and nanoparticles, for example composed of Ag; networks composed of carbon nanotubes; graphene particles and graphene layers; networks composed of semiconducting nanowires.

Furthermore, the first electrode 106 may include electrically conductive polymers or transition metal oxides or transparent electrically conductive oxides.

In various exemplary embodiments, the first electrode 106 and the substrate 102 may be formed as translucent or transparent. In the case where the first electrode 106 is formed from a metal, the first electrode 106 may have for example a layer thickness of less than or equal to approximately 25 nm, for example a layer thickness of less than or equal to approximately 20 nm, for example a layer thickness of less than or equal to approximately 18 nm. Furthermore, the first electrode 106 may have for example a layer thickness of greater than or equal to approximately 10 nm, for example a layer thickness of greater than or equal to approximately 15 nm. In various exemplary embodiments, the first electrode 106 may have a layer thickness in a range of approximately 10 nm to approximately 25 nm, for example a layer thickness in a range of approximately 10 nm to approximately 18 nm, for example a layer thickness in a range of approximately 15 nm to approximately 18 nm.

Furthermore, for the case where the first electrode 106 is formed from a transparent conductive oxide (TCO), the first electrode 106 may have for example a layer thickness in a range of approximately 50 nm to approximately 500 nm, for example a layer thickness in a range of approximately 75 nm to approximately 250 nm, for example a layer thickness in a range of approximately 100 nm to approximately 150 nm.

Furthermore, for the case where the first electrode 106 is formed from, for example, a network composed of metallic nanowires, for example composed of Ag, which may be combined with conductive polymers, a network composed of carbon nanotubes which may be combined with conductive polymers, or from graphene layers and composites, the first electrode 106 may have for example a layer thickness in a range of approximately 1 nm to approximately 500 nm, for example a layer thickness in a range of approximately 10 nm to approximately 400 nm, for example a layer thickness in a range of approximately 40 nm to approximately 250 nm.

The first electrode 106 may be formed as an anode, that is to say as a hole-injecting electrode, or as a cathode, that is to say as an electron-injecting electrode.

The first electrode 106 may have a first electrical terminal, to which a first electrical potential (provided by an energy source (not illustrated), for example a current source or a voltage source) may be applied. Alternatively, the first electrical potential may be applied to the substrate 102 and then be fed indirectly to the first electrode 106 via said substrate. The first electrical potential may be, for example, the ground potential or some other predefined reference potential.

Furthermore, the electrically active region 104 of the light emitting device 100 may have a functional layer system 110, also designated as an organic electroluminescent layer structure 110, which is applied on or above the first electrode 106.

The organic electroluminescent layer structure 110 may include a plurality of organic functional layer structures 112, 116. In various exemplary embodiments, the organic electroluminescent layer structure 110 may, however, also include more than two organic functional layer structures, for example 3, 4, 5, 6, 7, 8, 9, 10, or even more.

A first organic functional layer structure 112 and a second organic functional layer structure 116 are illustrated in FIG. 1.

The first organic functional layer structure 112 may be arranged on or above the first electrode 106. Furthermore, the second organic functional layer structure 116 may be arranged on or above the first organic functional layer structure 112. In various exemplary embodiments, a charge generating layer structure 114 (charge generation layer, CGL) may be arranged between the first organic functional layer structure 112 and the second organic functional layer structure 116. In exemplary embodiments in which more than two organic functional layer structures are provided, a respective charge generating layer structure may be provided between in each case two organic functional layer structures.

As will be explained in even greater detail below, each of the organic functional layer structures 112, 116 may include in each case one or a plurality of emitter layers, for example including fluorescent and/or phosphorescent emitters, and one or a plurality of hole-conducting layers (not illustrated in FIG. 1) (also designated as hole transport layer(s)). In various exemplary embodiments, one or a plurality of electron-conducting layers (also designated as electron transport layer(s)) may alternatively or additionally be provided.

Examples of emitter materials which may be used in the light emitting device 100 in accordance with various exemplary embodiments for the emitter layer(s) include organic or organometallic compounds such as derivatives of polyfluorene, polythiophene and polyphenylene (e.g. 2- or 2,5-substituted poly-p-phenylene vinylene) and metal complexes, for example iridium complexes such as blue phosphorescent FIrPic (bis(3,5-difluoro-2-(2-pyridyl)phenyl(2-carboxypyridyl)iridium III), green phosphorescent Ir(ppy)$_3$ (tris(2-phenylpyridine)iridium III), red phosphorescent Ru (dtb-bpy)$_3$*2(PF$_6$) (tris[4,4'-di-tert-butyl-(2,2')-bipyridine]ruthenium (III) complex) and blue fluorescent DPAVBi (4,4-bis[4-(di-p-tolylamino)styryl]biphenyl), green fluorescent TTPA (9,10-bis[N,N-di(p-tolyl)amino]anthracene) and red fluorescent DCM2 (4-dicyanomethylene)-2-methyl-6-julolidyl-9-enyl-4H-pyran) as non-polymeric emitters. Such non-polymeric emitters may be deposited by means of thermal evaporation, for example. Furthermore, it is possible to use polymer emitters, which may be deposited, in particular, by means of a wet-chemical method such as spin coating, for example.

The emitter materials may be embedded in a matrix material in a suitable manner.

It should be pointed out that other suitable emitter materials are likewise provided in other exemplary embodiments.

The emitter materials of the emitter layer(s) of the light emitting device 100 may be selected for example such that the light emitting device 100 emits white light. The emitter layer(s) may include a plurality of emitter materials that emit in different colors (for example blue and yellow or blue, green and red); alternatively, the emitter layer(s) may also be constructed from a plurality of partial layers, such as a blue fluorescent emitter layer or blue phosphorescent emitter layer, a green phosphorescent emitter layer and a red phosphorescent emitter layer. By mixing the different colors, the emission of light having a white color impression may result. Alternatively, provision may also be made for arranging a converter material in the beam path of the primary emission generated by said layers, which converter material at least partly absorbs the primary radiation and emits a secondary radiation having a different wavelength, such that a white color impression results from a (not yet white) primary radiation by virtue of the combination of primary and secondary radiation. Moreover, the emitter materials of different organic functional layer structures may be chosen such that although the individual emitter materials emit light of different colors (for example blue, green or red or arbitrary other color combinations, for example arbitrary other complementary color combinations), for example the overall light which is emitted overall by all the organic functional layer structures and is emitted toward the outside by the OLED is a light of predefined color, for example white light.

The organic functional layer structures 112, 116 may generally include one or a plurality of electroluminescent layers. The one or the plurality of electroluminescent layers may include organic polymers, organic oligomers, organic monomers, organic small, non-polymeric molecules ("small molecules") or a combination of these materials. By way of example, the organic electroluminescent layer structure 110 may include one or a plurality of electroluminescent layers embodied as a hole transport layer, so as to enable for example in the case of an OLED an effective hole injection into an electroluminescent layer or an electroluminescent region. Alternatively, in various exemplary embodiments, the organic functional layer structures 112, 116 may include one or a plurality of functional layers embodied as an electron transport layer, so as to enable for example in an OLED an effective electron injection into an electroluminescent layer or an electroluminescent region. By way of example, tertiary amines, carbazol derivatives, conductive polyaniline or polyethylene dioxythiophene may be used as material for the hole transport layer. In various exemplary embodiments, the one or the plurality of electroluminescent layers may be embodied as an electroluminescent layer.

Figure 2:
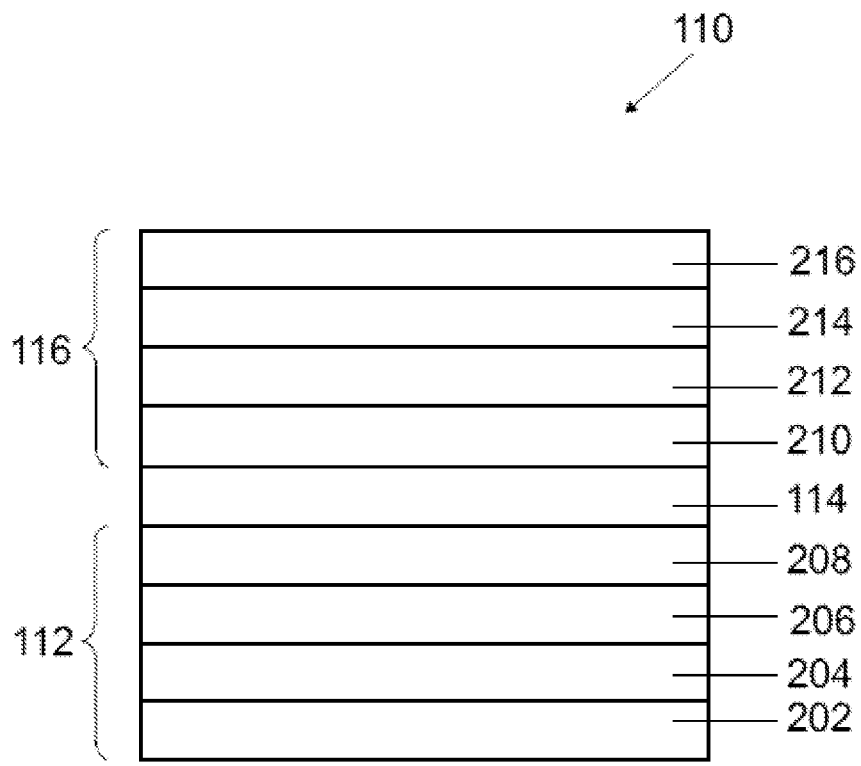
FIG. 2 shows a cross-sectional view of a functional layer system of an optoelectronic device in accordance with various exemplary embodiments.

As illustrated in FIG. 2, in various exemplary embodiments, the first organic functional layer structure 112 may include a hole injection layer 202, which may be applied, for example deposited, on or above the first electrode 106. In various exemplary embodiments, the hole injection layer 202 may include or consist of one or more of the following materials: HAT-(CN)6, Cu(I)pFBz, $MoO_x$, $WO_x$, $VO_x$, $ReO_x$, F4-TCNQ; NDP-2, NDP-9 from the company NOVALED; Bi(III)pFBz, F16CuPc; NPB (N,N'-bis(naphthalen-1-yl)-N, N'-bis(phenyl)-benzidine); beta-NPB N,N'-bis(naphthalen-2-yl)-N,N'-bis(phenyl)-benzidine); TPD (N,N'-bis(3-methylphenyl)-N,N'-bis(phenyl)-benzidine); spiro TPD (N,N'-bis (3-methylphenyl)-N,N'-bis(phenyl)-benzidine); spiro-NPB (N,N'-bis(naphthalen-1-yl)-N,N'-bis(phenyl)-spiro); DMFL-TPD N,N'-bis(3-methylphenyl)-N,N'-bis(phenyl)-9,9-dimethyl-fluorene); DMFL-NPB (N,N'-bis(naphthalen-1-yl)-N, N'-bis(phenyl)-9,9-dimethyl-fluorene); DPFL-TPD (N,N'-bis(3-methylphenyl)-N,N'-bis(phenyl)-9,9-diphenyl-fluorene); DPFL-NPB (N,N'-bis(naphthalen-1-yl)-N,N'-bis (phenyl)-9,9-diphenyl-fluorene); spiro-TAD (2,2',7,7'-tetrakis(N,N-diphenylamino)-9,9'-spirobifluorene); 9,9-bis [4-(N,N-bis-biphenyl-4-yl-amino)phenyl]-9H-fluorene; 9,9-bis[4-(N,N-bis-naphthalen-2-yl-amino)phenyl]-9H-fluorene; 9,9-bis[4-(N,N'-bis-naphthalen-2-yl-N,N'-bisphenyl-amino)-phenyl]-9H-fluorene; N,N'-bis(phenanthren-9-yl)-N,N'-bis(phenyl)-benzidine; 2,7-bis[N,N-bis(9,9-spiro-bifluoren-2-yl)-amino]-9,9-spiro-bifluorene; 2,2'-bis [N,N-bis(biphenyl-4-yl)amino]9,9-spiro-bifluorene; 2,2'-bis (N,N-di-phenyl-amino)9,9-spiro-bifluorene; di-[4-(N,N-ditolyl-amino)-phenyl]cyclohexane; 2,2',7,7'-tetra(N,N-ditolyl)amino-spiro-bifluorene; and N,N,N',N'-tetra-naphthalen-2-yl-benzidine.

The hole injection layer 202 may have a layer thickness in a range of approximately 10 nm to approximately 1000 nm, for example in a range of approximately 30 nm to approximately 300 nm, for example in a range of approximately 50 nm to approximately 200 nm.

A first hole transport layer 204 may be applied, for example deposited, on or above the hole injection layer 202. In various exemplary embodiments, the first hole transport layer 204 may include or consist of one or more of the following materials: NPB (N,N'-bis(naphthalen-1-yl)-N,N'-bis(phenyl)-benzidine); beta-NPB N,N'-bis(naphthalen-2-yl)-N,N'-bis (phenyl)-benzidine); TPD (N,N'-bis(3-methylphenyl)-N,N'-bis(phenyl)-benzidine); spiro TPD (N,N'-bis(3-methylphenyl)-N,N'-bis(phenyl)-benzidine); spiro-NPB (N,N'-bis(naphthalen-1-yl)-N,N'-bis(phenyl)-spiro); DMFL-TPD N,N'-bis(3-methylphenyl)-N,N'-bis(phenyl)-9,9-dimethyl-fluorene); DMFL-NPB (N,N'-bis(naphthalen-1-yl)-N, N'-bis(phenyl)-9,9-dimethyl-fluorene); DPFL-TPD (N,N'-bis(3-methylphenyl)-N,N'-bis(phenyl)-9,9-diphenyl-fluorene); DPFL-NPB (N,N'-bis(naphthalen-1-yl)-N,N'-bis (phenyl)-9,9-diphenyl-fluorene); spiro-TAD (2,2',7,7'-tetrakis(N,N-diphenylamino)-9,9'-spirobifluorene); 9,9-bis [4-(N,N-bis-biphenyl-4-yl-amino)phenyl]-9H-fluorene; 9,9-bis[4-(N,N-bis-naphthalen-2-yl-amino)phenyl]-9H-fluorene; 9,9-bis[4-(N,N'-bis-naphthalen-2-yl-N,N'-bisphenyl-amino)-phenyl]-9H-fluorene; N,N'-bis(phenanthren-9-yl)-N,N'-bis(phenyl)-benzidine; 2,7-bis[N,N-bis(9,9-spiro-bifluoren-2-yl)-amino]-9,9-spiro-bifluorene; 2,2'-bis [N,N-bis(biphenyl-4-yl)amino]9,9-spiro-bifluorene; 2,2'-bis (N,N-di-phenyl-amino)9,9-spiro-bifluorene; di-[4-(N,N-ditolyl-amino)-phenyl]cyclohexane; 2,2',7,7'-tetra(N,N-ditolyl)amino-spiro-bifluorene; and N,N,N',N'-tetra-naphthalen-2-yl-benzidine.

The first hole transport layer 204 may have a layer thickness in a range of approximately 5 nm to approximately 50 nm, for example in a range of approximately 10 nm to approximately 30 nm, for example approximately 20 nm.

A first emitter layer 206 may be applied, for example deposited, on or above the hole transport layer 204. The emitter materials which may be provided for example for the first emitter layer 206 are described above. In various exemplary embodiments, the first emitter layer 206 may have a layer thickness in a range of approximately 5 nm to approximately 50 nm, for example in a range of approximately 10 nm to approximately 30 nm, for example approximately 20 nm.

Furthermore, a first electron transport layer 208 may be arranged, for example deposited, on or above the first emitter layer 206. In various exemplary embodiments, the first electron transport layer 208 may include or consist of one or more of the following materials: NET-18 from the company NOVALED; 2,2',2"-(1,3,5-benzinetriyl)-tris(1-phenyl-1-H-benzimidazole); 2-(4-biphenylyl)-5-(4-tert-butylphenyl)-1,3,4-oxadiazole, 2,9-dimethyl-4,7-diphenyl-1,10-phenanthroline (BCP); 8-hydroxyquinolinolato-lithium, 4-(naphthalen-1-yl)-3,5-diphenyl-4H-1,2,4-triazole; 1,3-bis[2-(2,2'-bipyridin-6-yl)-1,3,4-oxadiazo-5-yl]benzene; 4,7-diphenyl-1,10-phenanthroline (Bphen); 3-(4-biphenylyl)-4-phenyl-5-tert-butylphenyl-1,2,4-triazole; bis(2-methyl-8-quinolinolate)-4-(phenylphenolato)aluminum; 6,6'-bis[5-(biphenyl-4-yl)-1,3, 4-oxadiazo-2-yl]-2,2'-bipyridyl; 2-phenyl-9,10-di (naphthalen-2-yl)-anthracene; 2,7-bis[2-(2,2'-bipyridin-6-yl)-1,3,4-oxadiazo-5-yl]-9,9-dimethylfluorene; 1,3-bis[2-(4-tert-butylphenyl)-1,3,4-oxadiazo-5-yl]benzene;
2-(naphthalen-2-yl)-4,7-diphenyl-1,10-phenanthroline; 2,9-bis(naphthalen-2-yl)-4,7-diphenyl-1,10-phenanthroline; tris (2,4,6-trimethyl-3-(pyridin-3-yl)phenyl)borane; 1-methyl-2-(4-(naphthalen-2-yl)phenyl)-1H-imidazo[4,5-f][1,10] phenanthroline; phenyl-dipyrenylphosphine oxide; naphthalenetetracarboxylic dianhydride or the imides thereof; perylenetetracarboxylic dianhydride or the imides thereof; and substances based on silols including a silacyclopentadiene unit.

The first electron transport layer 208 may have a layer thickness in a range of approximately 5 nm to approximately 50 nm, for example in a range of approximately 10 nm to approximately 30 nm, for example approximately 20 nm.

As described above, the (optional) hole injection layer 202, the (optional) first hole transport layer 204, the first emitter layer 206, and the (optional) first electron transport layer 208 form the first organic functional layer structure 112.

A charge generating layer structure (CGL) 114 is arranged on or above the first organic functional layer structure 112, and will be described in even greater detail below.

In various exemplary embodiments, the second organic functional layer structure 116 is arranged on or above the charge generating layer structure 114.

In various exemplary embodiments, the second organic functional layer structure 116 may include a hole transport layer 210, wherein the hole transport layer 210 is arranged on or above the charge generating layer structure 114. By way of example, the hole transport layer 210 may be in physical contact with the surface of the charge generating layer structure 114; to put it another way, they share a common interface. In various exemplary embodiments, the hole transport layer 210 may include or consist of one or more of the following materials: NPB (N,N'-bis(naphthalen-1-yl)-N,N'-bis(phenyl)-benzidine); beta-NPB N,N'-bis(naphthalen-2-yl)-N,N'-bis(phenyl)-benzidine); TPD (N,N'-bis(3-methylphenyl)-N, N'-bis(phenyl)-benzidine); spiro TPD (N,N'-bis(3-methylphenyl)-N,N'-bis(phenyl)-benzidine); spiro-NPB (N,N'-bis(naphthalen-1-yl)-N,N'-bis(phenyl)-spiro); DMFL-TPD N,N'-bis(3-methylphenyl)-N,N'-bis(phenyl)-9,9-dimethyl-fluorene); DMFL-NPB (N,N'-bis(naphthalen-1-yl)-N, N'-bis(phenyl)-9,9-dimethyl-fluorene); DPFL-TPD (N,N'-bis(3-methylphenyl)-N,N'-bis(phenyl)-9,9-diphenyl-fluorene); DPFL-NPB (N,N'-bis(naphthalen-1-yl)-N,N'-bis (phenyl)-9,9-diphenyl-fluorene); spiro-TAD (2,2',7,7'-tetrakis(N,N-diphenylamino)-9,9'-spirobifluorene); 9,9-bis[4-(N,N-bis-biphenyl-4-yl-amino)phenyl]-9H-fluorene; 9,9-bis[4-(N,N-bis-naphthalen-2-yl-amino)phenyl]-9H-fluorene; 9,9-bis[4-(N,N'-bis-naphthalen-2-yl-N,N'-bis-phenyl-amino)-phenyl]-9H-fluorene; N,N'-bis(phenanthren-9-yl)-N,N'-bis(phenyl)-benzidine; 2,7-bis[N,N-bis(9,9-spiro-bifluoren-2-yl)-amino]-9,9-spiro-bifluorene; 2,2'-bis [N,N-bis(biphenyl-4-yl)amino]9,9-spiro-bifluorene; 2,2'-bis (N,N-di-phenyl-amino)9,9-spiro-bifluorene; di-[4-(N,N-ditolyl-amino)-phenyl]cyclohexane; 2,2',7,7'-tetra(N,N-ditolyl)amino-spiro-bifluorene; and N,N,N',N'-tetra-naphthalen-2-yl-benzidine.

The hole transport layer 210 may have a layer thickness in a range of approximately 5 nm to approximately 50 nm, for example in a range of approximately 15 nm to approximately 40 nm, for example in a range of approximately 20 nm to approximately 30 nm.

Furthermore, the second organic functional layer structure 116 may include a second emitter layer 212, which may be arranged on or above the second hole transport layer 210. The second emitter layer 212 may include the same emitter materials as the first emitter layer 206. Alternatively, the second emitter layer 212 and the first emitter layer 206 may include different emitter materials. In various exemplary embodiments, the second emitter layer 212 may be designed in such a way that it emits electromagnetic radiation, for example light, having the same wavelength(s) as the first emitter layer 206. Alternatively, the second emitter layer 212 may be designed in such a way that it emits electromagnetic radiation, for example light, having a different wavelength or different wavelengths than the first emitter layer 206. The emitter materials of the second emitter layer may be materials such as have been described above.

Other suitable emitter materials may, of course, be provided both for the first emitter layer 206 and for the second emitter layer 212.

Furthermore, the second organic functional layer structure 116 may include a second electron transport layer 214, which may be arranged, for example deposited, on or above the second emitter layer 212.

In various exemplary embodiments, the second electron transport layer 214 may include or consist of one or more of the following materials: NET-18 from the company NOV-ALED; 2,2',2"-(1,3,5-benzinetriyl)-tris(1-phenyl-1-H-benzimidazole); 2-(4-biphenylyl)-5-(4-tert-butylphenyl)-1,3,4-oxadiazole, 2,9-dimethyl-4,7-diphenyl-1,10-phenanthroline (BCP); 8-hydroxyquinolinolato-lithium, 4-(naphthalen-1-yl)-3,5-diphenyl-4H-1,2,4-triazole; 1,3-bis[2-(2,2'-bipyridin-6-yl)-1,3,4-oxadiazo-5-yl]benzene; 4,7-diphenyl-1,10-phenanthroline (Bphen); 3-(4-biphenylyl)-4-phenyl-5-tert-butylphenyl-1,2,4-triazole; bis(2-methyl-8-quinolinolate)-4-(phenylphenolato)aluminum; 6,6'-bis[5-(biphenyl-4-yl)-1,3, 4-oxadiazo-2-yl]-2,2'-bipyridyl; 2-phenyl-9,10-di (naphthalen-2-yl)-anthracene; 2,7-bis[2-(2,2'-bipyridin-6-yl)-1,3,4-oxadiazo-5-yl]-9,9-dimethylfluorene; 1,3-bis[2-(4-tert-butylphenyl)-1,3,4-oxadiazo-5-yl]benzene; 2-(naphthalen-2-yl)-4,7-diphenyl-1,10-phenanthroline; 2,9-bis(naphthalen-2-yl)-4,7-diphenyl-1,10-phenanthroline; tris (2,4,6-trimethyl-3-(pyridin-3-yl)phenyl)phenyl)borane; 1-methyl-2-(4-(naphthalen-2-yl)phenyl)-1H-imidazo[4,5-f][1,10]phenanthroline; phenyl-dipyrenylphosphine oxide; naphthalenetetracarboxylic dianhydride or the imides thereof; perylenetetracarboxylic dianhydride or the imides thereof; and substances based on silols including a silacyclopentadiene unit.

The second electron transport layer 214 may have a layer thickness in a range of approximately 5 nm to approximately 50 nm, for example in a range of approximately 15 nm to approximately 40 nm, for example in a range of approximately 20 nm to approximately 30 nm.

Furthermore, an electron injection layer 216 may be applied, for example deposited, on or above the second electron transport layer 214.

In various exemplary embodiments, the electron injection layer 216 may include or consist of one or more of the following materials: NDN-26 from the company NOVALED, MgAg, $Cs_2CO_3$, $Cs_3PO_4$, Na, Ca, K, Mg, Cs, Li, LiF; 2,2', 2"-(1,3,5-benzinetriyl)-tris(1-phenyl-1-H-benzimidazole); 2-(4-biphenylyl)-5-(4-tert-butylphenyl)-1,3,4-oxadiazole, 2,9-dimethyl-4,7-diphenyl-1,10-phenanthroline (BCP); 8-hydroxyquinolinolato-lithium, 4-(naphthalen-1-yl)-3,5-diphenyl-4H-1,2,4-triazole; 1,3-bis[2-(2,2'-bipyridin-6-yl)-1,3,4-oxadiazo-5-yl]benzene; 4,7-diphenyl-1,10-phenanthroline (Bphen); 3-(4-biphenylyl)-4-phenyl-5-tert-butylphenyl-1,2,4-triazole; bis(2-methyl-8-quinolinolate)-4-(phenylphenolato)aluminum; 6,6'-bis[5-(biphenyl-4-yl)-1,3, 4-oxadiazo-2-yl]-2,2'-bipyridyl; 2-phenyl-9,10-di (naphthalen-2-yl)-anthracene; 2,7-bis[2-(2,2'-bipyridin-6-yl)-1,3,4-oxadiazo-5-yl]-9,9-dimethylfluorene; 1,3-bis[2-(4-tert-butylphenyl)-1,3,4-oxadiazo-5-yl]benzene; 2-(naphthalen-2-yl)-4,7-diphenyl-1,10-phenanthroline; 2,9-bis(naphthalen-2-yl)-4,7-diphenyl-1,10-phenanthroline; tris (2,4,6-trimethyl-3-(pyridin-3-yl)phenyl)borane; 1-methyl-2-(4-(naphthalen-2-yl)phenyl)-1H-imidazo[4,5-f][1,10] phenanthroline; phenyl-dipyrenylphosphine oxide; naphthalenetetracarboxylic dianhydride or the imides thereof; perylenetetracarboxylic dianhydride or the imides thereof; and substances based on silols including a silacyclopentadiene unit.

The electron injection layer 216 may have a layer thickness in a range of approximately 5 nm to approximately 200 nm, for example in a range of approximately 20 nm to approximately 50 nm, for example approximately 30 nm.

As described above, the (optional) second hole transport layer 210, the second emitter layer 212, the (optional) second electron transport layer 214, and the (optional) electron injection layer 216 form the second organic functional layer structure 116.

In various exemplary embodiments, the organic electroluminescent layer structure 110 (that is to say for example the sum of the thicknesses of hole transport layer(s) and emitter layer(s) and electron transport layer(s), etc.) may have a layer thickness of a maximum of approximately 1.5 µm, for example a layer thickness of a maximum of approximately 1.2 µm, for example a layer thickness of a maximum of approximately 1 µm, for example a layer thickness of a maximum of approximately 800 nm, for example a layer thickness of a maximum of approximately 500 nm, for example a layer thickness of a maximum of approximately 400 nm, for example a layer thickness of a maximum of approximately 300 nm. In various exemplary embodiments, the organic electroluminescent layer structure 110 may have for example a stack of a plurality of organic light emitting diodes (OLEDs) arranged directly one above another, wherein each OLED may have for example a layer thickness of a maximum of approximately 1.5 µm, for example a layer thickness of a maximum of approximately 1.2 µm, for example a layer thickness of a maximum of approximately 1 µm, for example a layer thickness of a maximum of approximately 800 nm, for example a layer thickness of a maximum of approximately 500 nm, for example a layer thickness of a maximum of approximately 400 nm, for example a layer thickness of a maximum of approximately 300 nm. In various exemplary embodiments, the organic electroluminescent layer structure 110 may have for example a stack of two, three or four OLEDs arranged directly one above another, in which case for example the organic electroluminescent layer structure 110 may have a layer thickness of a maximum of approximately 3 µm.

The light emitting device 100 may optionally generally include further organic functional layers, for example arranged on or above the one or the plurality of emitter layers or on or above the electron transport layer(s), which serve to further improve the functionality and thus the efficiency of the light emitting device 100.

The second electrode 108 (for example in the form of a second electrode layer 108) may be applied on or above the organic electroluminescent layer structure 110 or, if appropriate, on or above the one or the plurality of further organic functional layers, as described above.

In various exemplary embodiments, the second electrode 108 may include or be formed from the same materials as the first electrode 106, metals being particularly suitable in various exemplary embodiments.

In various exemplary embodiments, the second electrode 108 (for example for the case of a metallic second electrode 108) may have for example a layer thickness of less than or equal to approximately 2000 nm, for example a layer thickness of less than or equal to approximately 1000 nm, for example a layer thickness of less than or equal to approximately 500 nm, for example a layer thickness of less than or equal to approximately 200 nm, for example a layer thickness of less than or equal to approximately 100 nm, for example a layer thickness of less than or equal to approximately 50 nm, for example a layer thickness of less than or equal to approximately 45 nm, for example a layer thickness of less than or equal to approximately 40 nm, for example a layer thickness of less than or equal to approximately 35 nm, for example a layer thickness of less than or equal to approximately 30 nm, for example a layer thickness of less than or equal to approximately 25 nm, for example a layer thickness of less than or equal to approximately 20 nm, for example a layer thickness of less than or equal to approximately 15 nm, for example a layer thickness of less than or equal to approximately 10 nm.

The second electrode 108 may generally be formed in a similar manner to the first electrode 106, or differently than the latter. In various exemplary embodiments, the second electrode 108 may be formed from one or more of the materials and with the respective layer thickness, as described above in connection with the first electrode 106. In various exemplary embodiments, both the first electrode 106 and the second electrode 108 are formed as translucent or transparent. Consequently, the light emitting device 100 illustrated in FIG. 1 may be designed as a top and bottom emitter (to put it another way as a transparent light emitting device 100).

The second electrode 108 may be formed as an anode, that is to say as a hole-injecting electrode, or as a cathode, that is to say as an electron-injecting electrode.

The second electrode 108 may have a second electrical terminal, to which a second electrical potential (which is different than the first electrical potential), provided by the energy source, may be applied. The second electrical potential may have for example a value such that the difference with respect to the first electrical potential has a value in a range of approximately 1.5 V to approximately 20 V, for example a value in a range of approximately 2.5 V to approximately 15 V, for example a value in a range of approximately 3 V to approximately 12 V.

An encapsulation 118, for example in the form of a barrier thin-film layer/thin-film encapsulation 118, may optionally also be formed on or above the second electrode 108 and thus on or above the electrically active region 104.

In the context of this application, a "barrier thin-film layer" or a "barrier thin film" 118 may be understood to mean, for example, a layer or a layer structure which is suitable for forming a barrier against chemical impurities or atmospheric substances, in particular against water (moisture) and oxygen. In other words, the barrier thin-film layer 118 is formed in such a way that OLED-damaging substances such as water, oxygen or solvent cannot penetrate through it or at most very small proportions of said substances may penetrate through it.

In accordance with one configuration, the barrier thin-film layer 118 may be formed as an individual layer (to put it another way, as a single layer). In accordance with an alternative configuration, the barrier thin-film layer 118 may include a plurality of partial layers formed one on top of another. In other words, in accordance with one configuration, the barrier thin-film layer 118 may be formed as a layer stack. The barrier thin-film layer 118 or one or a plurality of partial layers of the barrier thin-film layer 118 may be formed for example by means of a suitable deposition method, e.g. by means of an atomic layer deposition (ALD) method in accordance with one configuration, e.g. a plasma enhanced atomic layer deposition (PEALD) method or a plasmaless atomic layer deposition (PLALD) method, or by means of a chemical vapor deposition (CVD) method in accordance with various embodiments, e.g. a plasma enhanced chemical vapor deposition (PECVD) method or a plasmaless chemical vapor deposition (PLCVD) method, or alternatively by means of other suitable deposition methods.

By using an atomic layer deposition (ALD) method, it is possible for very thin layers to be deposited. In particular, layers having layer thicknesses in the atomic layer range may be deposited.

In accordance with one configuration, in the case of a barrier thin-film layer 118 having a plurality of partial layers, all the partial layers may be formed by means of an atomic layer deposition method. A layer sequence including only ALD layers may also be designated as a "nanolaminate".

In accordance with an alternative configuration, in the case of a barrier thin-film layer 118 including a plurality of partial layers, one or a plurality of partial layers of the barrier thin-film layer 118 may be deposited by means of a different deposition method than an atomic layer deposition method, for example by means of a vapor deposition method.

In accordance with one configuration, the barrier thin-film layer 118 may have a layer thickness of approximately 0.1 nm (one atomic layer) to approximately 1000 nm, for example a layer thickness of approximately 10 nm to approximately 100 nm in accordance with one configuration, for example approximately 40 nm in accordance with one configuration.

In accordance with one configuration in which the barrier thin-film layer 118 includes a plurality of partial layers, all the partial layers may have the same layer thickness. In accordance with various embodiments, the individual partial layers of the barrier thin-film layer 118 may have different layer thicknesses. In other words, at least one of the partial layers may have a different layer thickness than one or more other partial layers.

In accordance with one configuration, the barrier thin-film layer 118 or the individual partial layers of the barrier thin-film layer 118 may be formed as a translucent or transparent layer. In other words, the barrier thin-film layer 118 (or the individual partial layers of the barrier thin-film layer 118) may consist of a translucent or transparent material (or a material combination that is translucent or transparent).

In accordance with one configuration, the barrier thin-film layer 118 or (in the case of a layer stack having a plurality of partial layers) one or a plurality of the partial layers of the barrier thin-film layer 118 may include or consist of one of the following materials: aluminum oxide (alumina), zinc oxide, zirconium oxide, titanium oxide, hafnium oxide, tantalum oxide, lanthanum oxide, silicon oxide, silicon nitride, silicon oxynitride, indium tin oxide, indium zinc oxide, aluminum-doped zinc oxide, and mixtures and alloys thereof. In various exemplary embodiments, the barrier thin-film layer 118 or (in the case of a layer stack having a plurality of partial layers) one or a plurality of the partial layers of the barrier thin-film layer 118 may include one or a plurality of high refractive index materials, to put it another way one or a plurality of materials having a high refractive index, for example having a refractive index of at least 2.

In various exemplary embodiments, on or above the encapsulation 118, it is possible to provide an adhesive and/or a protective lacquer 120, by means of which, for example, a cover 122 (for example a glass cover 122) is fixed, for example adhesively bonded, on the encapsulation 118. In various exemplary embodiments, the optically translucent layer composed of adhesive and/or protective lacquer 120 may have a layer thickness of greater than 1 µm, for example a layer thickness of several µm. In various exemplary embodiments, the adhesive may include or be a lamination adhesive.

In various exemplary embodiments, light-scattering particles may also be embedded into the layer of the adhesive (also designated as adhesive layer), which particles may lead to a further improvement in the color angle distortion and the coupling-out efficiency. In various exemplary embodiments, the light-scattering particles provided may be dielectric scattering particles, for example, such as metal oxides, for example, such as e.g. silicon oxide ($SiO_2$), zinc oxide (ZnO), zirconium oxide ($ZrO_2$), indium tin oxide (ITO) or indium zinc oxide (IZO), gallium oxide ($Ga_2O_a$), aluminum oxide, or titanium oxide. Other particles may also be suitable provided that they have a refractive index that is different than the effective refractive index of the matrix of the translucent layer structure, for example air bubbles, acrylate, or hollow glass beads. Furthermore, by way of example, metallic nanoparticles, metals such as gold, silver, iron nanoparticles, or the like may be provided as light-scattering particles.

In various exemplary embodiments, between the second electrode 108 and the layer composed of adhesive and/or protective lacquer 120 an electrically insulating layer (not shown) may also be applied, for example SiN, for example having a layer thickness in a range of approximately 300 nm to approximately 1.5 µm, for example having a layer thickness in a range of approximately 500 nm to approximately 1 µm, in order to protect electrically unstable materials, during a wet-chemical process for example.

Furthermore, it should be pointed out that, in various exemplary embodiments, an adhesive 120 may also be completely dispensed with, for example in embodiments in which the cover 122, for example composed of glass, is applied to the encapsulation 118 by means of plasma spraying, for example.

Furthermore, in various exemplary embodiments, one or a plurality of antireflective layers (for example combined with the encapsulation 118, for example the thin-film encapsulation 118) may additionally be provided in the light emitting device 100.

Figure 3:
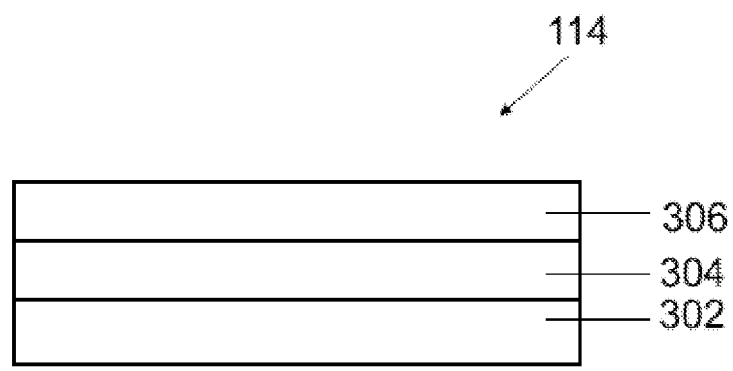
FIG. 3 shows a cross-sectional view of a charge generating layer structure of an optoelectronic device in accordance with various exemplary embodiments.

FIG. 3 illustrates the construction of a charge generating layer 114 in accordance with various exemplary embodiments in a cross-sectional view.

In various exemplary embodiments, the charge generating layer structure 114 may include a second electron-conducting charge generating layer 302 and a first electron-conducting charge generating layer 306, wherein the second electron-conducting charge generating layer 302 may be arranged on or above the first electron transport layer 208, for example may be in physical contact with the latter. The first electron-conducting charge generating layer 306 may be arranged on or above the second electron-conducting charge generating layer 302, wherein an interlayer 304 is provided between these two layers 302, 306. The hole transport layer 210 may be arranged on or above the first electron-conducting charge generating layer 306, wherein the hole transport layer 210 may also be designed as hole-conducting charge generating layer 210 by virtue of charge carrier pairs being generated and separated at the common interface of first electron-conducting charge generating layer 306 and hole transport layer 210.

In a manner similar to inorganic layers at high temperatures in the manufacture of semiconductor devices, for example at temperatures of greater than 200° C., during manufacture and during operation even at temperatures of less than 100° C. organic layers may diffuse into other layers (partial layer interdiffusion), e.g. parts of the second electron-conducting charge generating layer 302 into the first electron-conducting charge generating layer 306 of a charge generating layer structure 114 in an optoelectronic device, for example an OLED.

When an electric field is applied across the charge generating layer structure, a voltage drop across this layer structure is measurable by means of the layer interdiffusion. Said voltage drop increases with the operating period, since the diffusion of conductive organic substances may be directed in an electric field. This may limit the life time of the operating period of organic optoelectronic devices.

In order to suppress the partial layer interdiffusion (that is to say, illustratively, to achieve a barrier effect), the interlayer 304 may be inserted between the individual organic layers, e.g. between the first electron-conducting charge generating layer 306 and the second electron-conducting charge generating layer 302.

In various exemplary embodiments, the charge generating layer structure 114 is extended by the interlayer 304 between the charge generating layers 302 and 306 in order to prevent a partial layer interdiffusion between the charge generating layers 302 und 306.

In this case, the interlayer prevents the layer interdiffusion, for example of the dopant or of the matrix substance. Furthermore, the interlayer may prevent a reaction of the first electron-conducting charge generating layer 306 with the second electron-conducting charge generating layer 302, i.e. the interlayer 304 forms a reaction barrier. Furthermore, the interlayer 304 may reduce the interfacial roughness between the second electron-conducting charge generating layer 302 and the first electron-conducting charge generating layer 306 by the surface roughness of the second electron-conducting charge generating layer being reduced or compensated for by means of the interlayer.

In various exemplary embodiments, the second electron-conducting charge generating layer 302 may be composed of a plurality of substances, that is to say for example a substance mixture, or of a single substance (for this reason, the second electron-conducting charge generating layer 302 may also be designated as an undoped second electron-conducting charge generating layer 302). The substance forming the second electron-conducting charge generating layer 302, that is to say for example the substance of which the second electron-conducting charge generating layer 302 consists, may have a high electron conductivity (for example an electron conductivity of an order of magnitude of for example better than approximately $10^{-7}$ S/m, for example better than approximately $10^{-6}$ S/m, for example better than approximately $10^{-5}$ S/m). Furthermore, the substance of the second electron-conducting charge generating layer 302 may have a low work function (for example a work function of less than or equal to approximately 3 eV) and a low absorption of visible light. In various exemplary embodiments, as substance of the second electron-conducting charge generating layer 302 it is possible to provide any substance which fulfills these stated conditions, for example an NET-18 matrix with NDN-26 dopant (substance mixture) or NDN-26, MgAg, $Cs_2CO_3$, $Cs_3PO_4$, Na, Ca, K, Mg, Cs, Li, LiF (substance)-NDN26 an NET from the company NOVALED.

In various exemplary embodiments, the second electron-conducting charge generating layer 302 may have a layer thickness in a range of approximately 1 nm to approximately 500 nm, for example in a range of approximately 3 nm to approximately 100 nm, for example in a range of approximately 10 nm to approximately 90 nm, for example in a range of approximately 20 nm to approximately 80 nm, for example in a range of approximately 30 nm to approximately 70 nm, for example in a range of approximately 40 nm to approximately 60 nm, for example a layer thickness of approximately 50 nm.

In various exemplary embodiments, the first electron-conducting charge generating layer 306 may be composed of a plurality of substances, that is to say for example a substance mixture, or of a single substance (for this reason, the first electron-conducting charge generating layer 306 may also be designated as an undoped first electron-conducting charge generating layer 306). The substance forming the first electron-conducting charge generating layer 306, that is to say for example the substance of which the first electron-conducting charge generating layer 306 consists, may have a high conductivity (for example a conductivity of an order of magnitude of for example better than approximately $10^{-5}$ S/m, for example better than approximately $10^{-4}$ S/m, for example better than approximately $10^{-3}$ S/m). Furthermore, the substance of the first electron-conducting charge generating layer 306 may have a high work function, for example a work function in a range of approximately 5.0 eV to approximately 5.5 eV, and a low absorption of visible light. In various exemplary embodiments, as substance of the first electron-conducting charge generating layer 306 it is possible to provide any material or any substance which fulfills these stated conditions, for example HAT-$(CN)_6$, Cu(I)pFBz, $MoO_x$, $WO_x$, $VO_x$, $ReO_x$, F4-TCNQ, NDP-2, NDP-9, Bi(III)pFBz, F16CuPc.

In various exemplary embodiments, the first electron-conducting charge generating layer 306 may have a layer thickness in a range of approximately 1 nm to approximately 500 nm, for example in a range of approximately 3 nm to approximately 100 nm, for example in a range of approximately 10 nm to approximately 90 nm, for example in a range of approximately 20 nm to approximately 80 nm, for example in a range of approximately 30 nm to approximately 70 nm, for example in a range of approximately 40 nm to approximately 60 nm, for example a layer thickness of approximately 50 nm.

In various exemplary embodiments, the first electron-conducting charge generating layer 306 may include a substance or substance mixture having high conductivity and a conduction band (Lowest Unoccupied Molecule Orbital, LUMO) which is energetically approximately equal relative to the valence band (Highest Occupied Molecule Orbital, HOMO) of the directly or indirectly adjacent hole transport layer 210 or hole-conducting charge generating layer 210 and the valence band of the second electron-conducting charge generating layer 302. To put it another way, the substance or the substance mixture of the first electron-conductive charge generating layer 306 has a LUMO that is energetically approximately at the same level as the HOMO of the substance or substance mixture of the hole transport layer 210 and the HOMO of the second electron-conducting charge generating layer 302.

In this case, the charge carrier pair is generated and separated at the common interface of the hole transport layer 210 with the first electron-conducting charge generating layer 306 in such a way that the hole of the charge carrier pair generated is transported in the hole transport layer 210 to the emitter layer 212 of the second organic functional layer structure 116, and wherein the electron of the charge carrier pair generated is transported by means of the first electron-conducting charge generating layer 306 and second charge generating layer 302 to the first emitter layer 206 of the first organic functional layer structure 112. In other words, the hole transport layer 210 may additionally be designed as a hole-conducting charge generating layer 210.

The interlayer 304 may have a layer thickness in a range of approximately 1 nm to approximately 200 nm, for example in a range of approximately 3 nm to approximately 100 nm, for example in a range of approximately 5 nm to approximately 10 nm, for example a layer thickness of approximately 6 nm. The charge carrier conduction through the interlayer 304 may take place directly or indirectly.

The substance or the substance mixture of the interlayer 304 may be an electrical insulator in the case of an indirect charge carrier conduction. The HOMO of the electrically insulating substance of the interlayer 304 may be higher than the LUMO of the directly adjacent first electron-conducting charge generating layer 306 and higher than the HOMO of the directly adjacent second electron-conducting charge generating layer 302. A tunneling current through the interlayer 304 may be effected as a result.

Suitable substance for the interlayer 304 are phthalocyanine derivatives, for example unsubstituted phthalocyanine ($H_2Pc$); for example metal oxide phthalocyanine compounds, for example vanadium oxide phthalocyanine (VOPc), titanium oxide phthalocyanine (TiOPc); for example metal phthalocyanine derivatives, for example copper phthalocyanine (CuPc), cobalt phthalocyanine (CoPc), aluminum phthalocyanine (AlPc), nickel phthalocyanine (NiPc), iron phthalocyanine (FePc), zinc phthalocyanine (ZnPc) or manganese phthalocyanine (MnPC).

In a first specific implementation of various exemplary embodiments, which, however, is not intended to be of any restrictive character whatsoever, the charge generating layer structure 114 includes the following layers:

second electron-conducting charge generating layer 302: NDN-26 dopant in an NET-18 matrix having a layer thickness of approximately 50 nm, wherein the substance mixture includes NDN-26 in a mass proportion of approximately 8%;
interlayer 304:
VOPc having a layer thickness of approximately 4 nm; and
first electron-conducting charge generating layer 306:
HAT-(CN)$_6$ having a layer thickness in a range of approximately 10 nm to approximately 90 nm.

In this implementation, the first electron transport layer 208 may include NET-18 having a layer thickness of approximately 100 nm. Furthermore, the hole transport layer 210 in this implementation may include NPB having a layer thickness of approximately 25 nm.

In a second specific implementation of various exemplary embodiments, which, however, is not intended to be of any restrictive character whatsoever, the charge generating layer structure 114 includes the following layers:

second electron-conducting charge generating layer 302: NDN-26 dopant in an NET-18 matrix having a layer thickness of approximately 50 nm, wherein the substance mixture includes NDN-26 in a mass proportion of approximately 8%;
interlayer 304:
TiOPc having a layer thickness of approximately 4 nm; and
first electron-conducting charge generating layer 306:
HAT-(CN)6 having a layer thickness in a range of approximately 10 nm to approximately 90 nm.

In this implementation, the first electron transport layer 208 may include NET-18 having a layer thickness of approximately 50 nm. Furthermore, the hole transport layer 210 in this implementation may include NPB having a layer thickness of approximately 25 nm.

Figure 4:
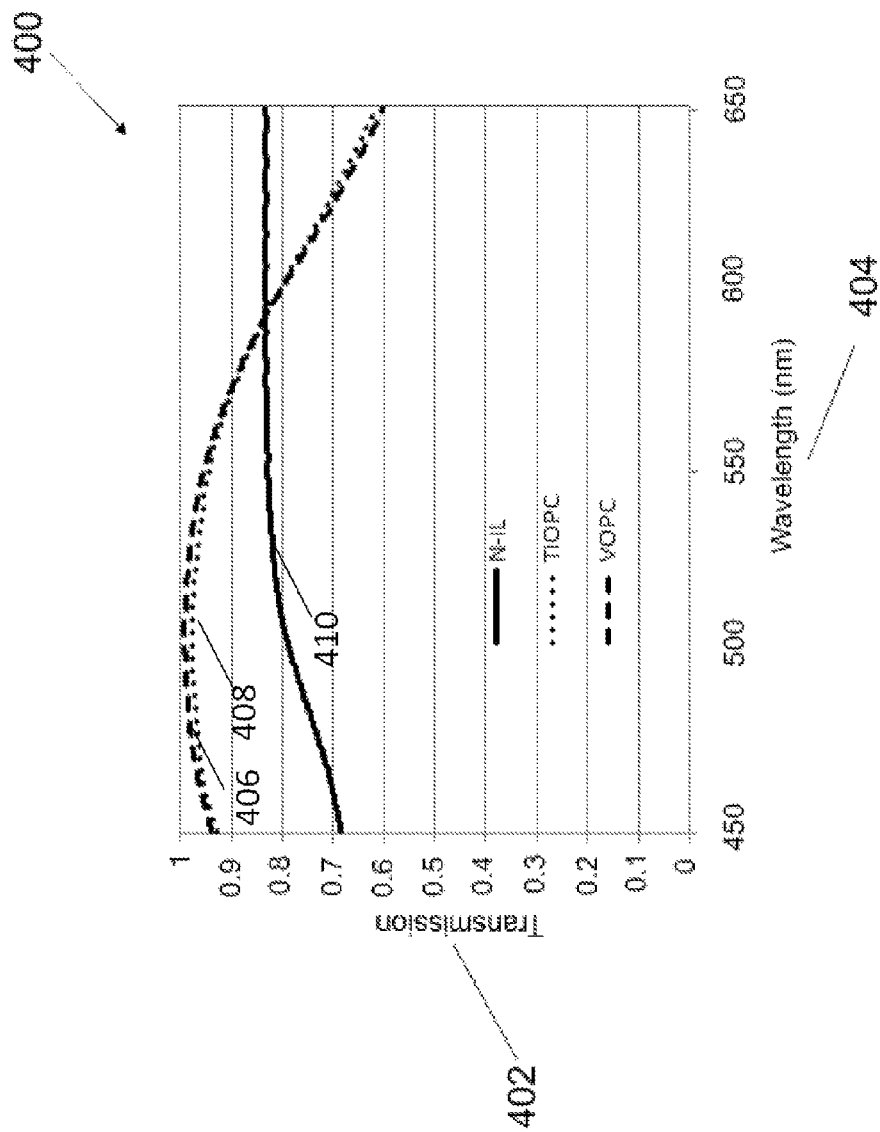
FIG. 4 shows a measured optical transmission of an interlayer of a charge generating layer structure in accordance with a first and second implementation.

FIG. 4 shows a measured optical transmission diagram 400 of an interlayer of a charge generating layer structure 114 in accordance with a first specific implementation 406 and a second specific implementation 408 of the charge generating layer structure 114 in comparison with an optical transmission of an interlayer of a charge generating layer structure 114 including the previously used substance NET-39 (from the company NOVALED) 410 for the interlayer 304 in a transmission diagram 400. The illustration shows the measured transmission 402 as a function of the wavelength of the incident light 404 in characteristic curves 406, 408 and 410. It is evident that the transmission of the metal oxide phthalocyanines VOPc 406 and TiOPc 408 in the spectral range of approximately 450 nm to approximately 600 nm is higher than the transmission of NET-39 410.

Figure 5:
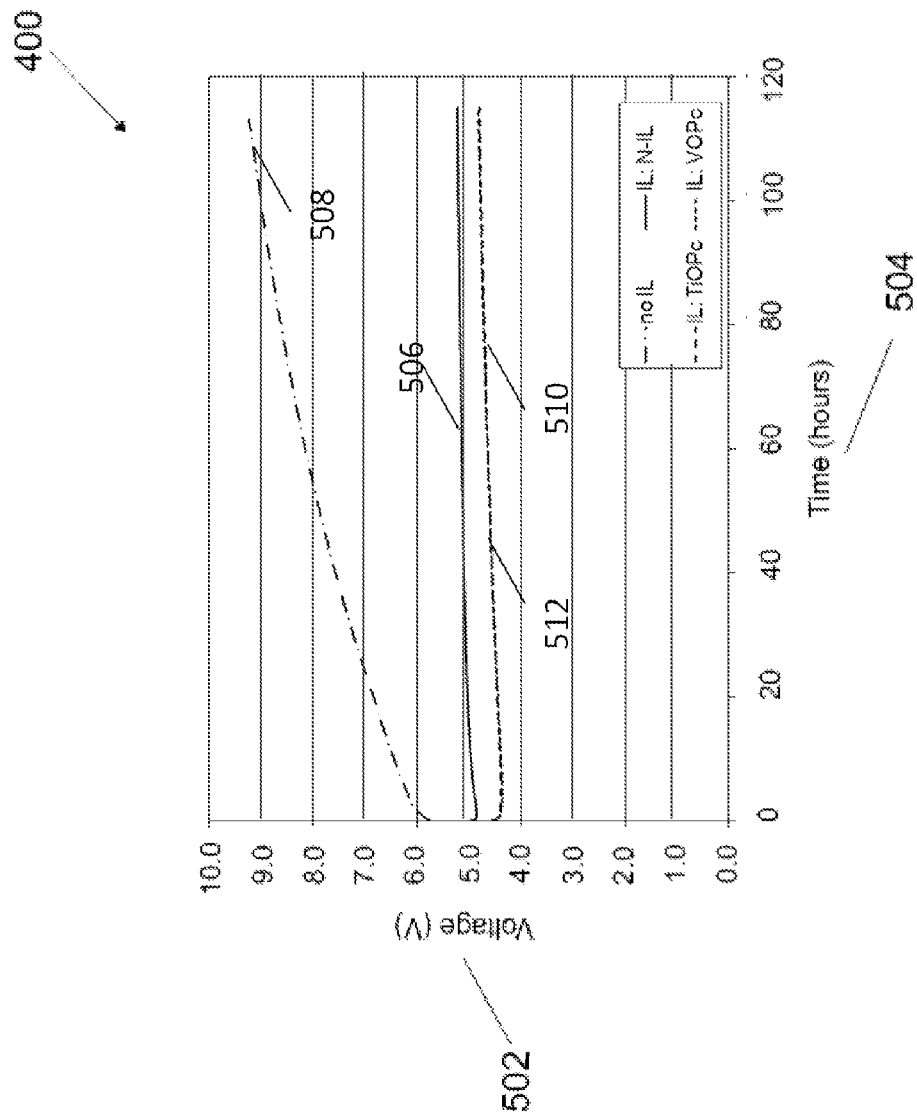
FIG. 5 shows a measured temperature/voltage stability of a charge generating layer structure in accordance with a first and second implementation.

FIG. 5 shows a measured temperature/voltage diagram 500 of a charge generating layer structure 114 in accordance with a first specific implementation 512 and a second specific implementation 510 of the charge generating layer structure 114 and an interlayer 304 including the previously used substance NET-39 508 and without 506 interlayer 304 in the charge generating layer structure 114. In the temperature/voltage diagram 500, a measured voltage drop 502 across the charge generating layer structure 114 is illustrated as a function of time 504 at a predefined temperature (approximately 85° C.) and a predefined current density (10 mA/cm$^2$). The diagram reveals a high voltage stability of the charge generating layer structure 114 including VOPc 512 and TiOPc 510 as substance for the interlayer 304 in comparison with the previously used substance NET-39 508 and without 506 interlayer 304. The temperature-voltage curves of VOPc 512 and TiOPc 510 lie one above the other and furthermore exhibit a smaller voltage drop across the interlayer in comparison with the previously used substance NET-39 508 and without 506 interlayer 304.

Figure 6:
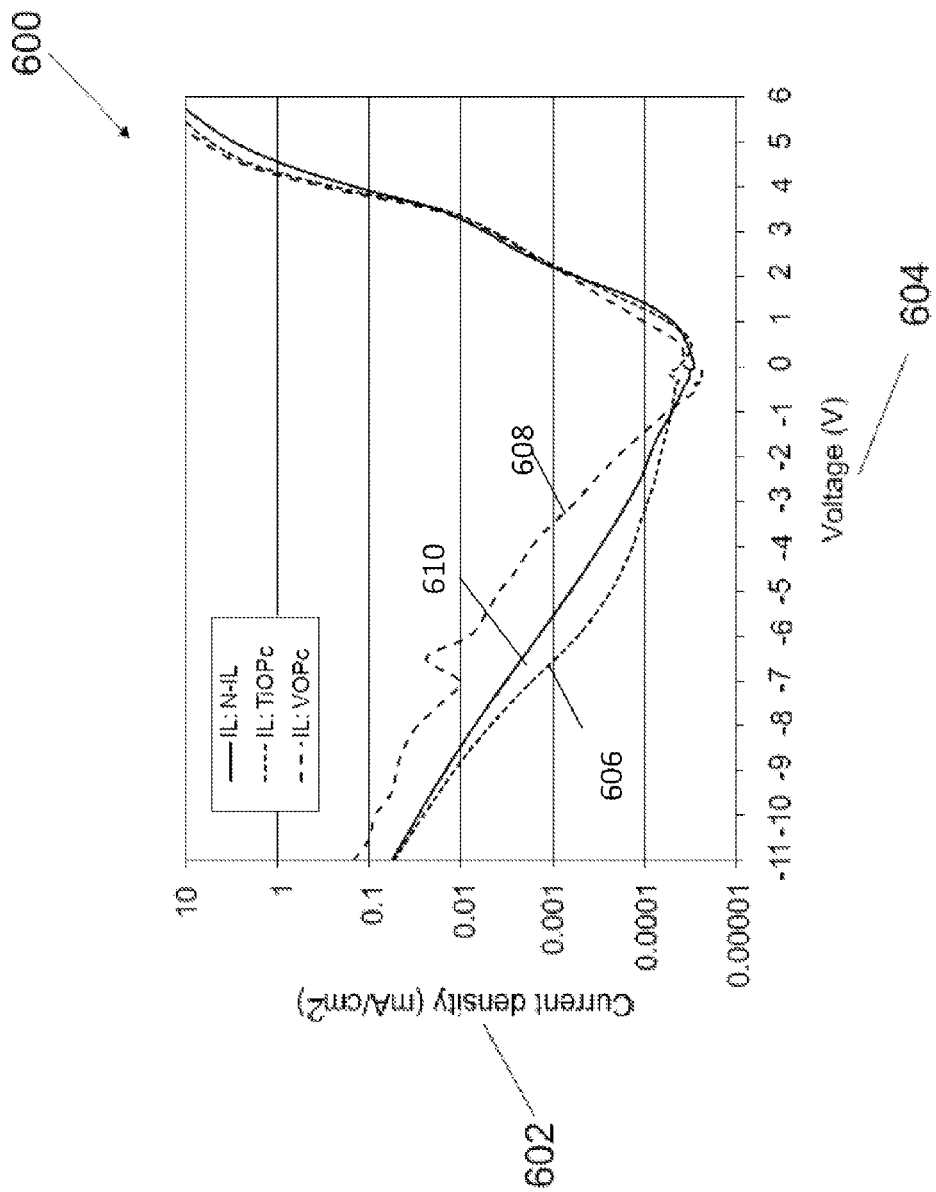
FIG. 6 shows a measured current-voltage characteristic curve of a charge generating layer structure in accordance with a first and second implementation.

FIG. 6 shows a conductivity diagram 600 of a charge generating layer structure 114 in accordance with a first specific implementation 608 and a second specific implementation 606 of the charge generating layer structure 114 and an interlayer 304 including previously used substance NET-39 610.

In the conductivity diagram 600, a measured current density 602 is illustrated at a function of an applied voltage 604.

It is evident that the characteristic curves of VOPc 608, TiOPc 606 and NET-39 610 have the form of a characteristic curve of a pn diode.

In various exemplary embodiments, a charge generating layer structure is provided for an optoelectronic device, for example for an OLED, wherein the optoelectronic resistance of the charge generating layer structure is lower than in charge generating layer structures used heretofore.

In various exemplary embodiments, a charge generating layer structure is provided, wherein the first electron-conducting charge generating layer is formed from a single substance and thus without doped layers, for example HAT-(CN)6, Cu(I)pFBz, MoO$_x$, WO$_x$, VO$_x$, ReO$_x$, F4-TCNQ, NDP-2, NDP-9, bi(III)pFBz, F16CuPc. To put it another way, a layer including a dopant in a matrix is not realized.

In various exemplary embodiments, a charge generating layer structure is provided, wherein the interlayer includes as substance one or a plurality of phthalocyanine derivatives, for example unsubstituted metal phthalocyanine, metal phthalocyanines or metal oxide phthalocyanines. The phthalocyanine derivatives used as substance for the interlayer, for example vanadium oxide phthalocyanine (VOPc), titanium oxide phthalocyanine (TiOPc), copper phthalocyanine (CuPc), unsubstituted phthalocyanine (H$_2$Pc), cobalt phthalocyanine (CoPc), aluminum phthalocyanine (AlPc), nickel phthalocyanine (NiPc), iron phthalocyanine (FePc), zinc phthalocyanine (ZnPc) or manganese phthalocyanine (MnPC), by means of their crystallization structure, exhibit a better barrier effect than the substance NET-39 used heretofore. This is manifested in the better voltage stability of the charge generating layer structure including metal oxide phthalocyanine as substance of the interlayer. As a result, it is possible to increase the operating period of the optoelectronic device, compared with the substance for the interlayer NET-39 used heretofore.

The optical resistance is particularly low in the case of a combination of HAT-(CN)6 (first electron-conducting charge generating layer composed of a single substance) and the metal oxide phthalocyanine, which is manifested in a higher transmission in the wavelength range of 450 nm to 650 nm than in the case of the substance NET-39 used heretofore for the interlayer.

As a result of the lower optoelectronic resistance of the substance combination of HAT-(CN)6 and metal phthalocyanine or metal oxide phthalocyanine, i.e. the low absorption and the higher voltage stability, the efficiency of the optoelectronic device may be increased compared with substance combinations used heretofore.

A process engineering advantage of this approach in accordance with various exemplary embodiments may furthermore be seen in the fact that for the first electron-conducting charge generating layer and/or for the second electron-conducting charge generating layer, in each case only a small number of organic substances are required, which may be evaporated in vacuo from evaporator sources (also designated as substance source) at temperatures of below 500° C.

While specific aspects have been described, it should be understood by those skilled in the art that various changes in form and detail may be made therein without departing from the spirit and scope of the aspects of this disclosure as defined by the appended claims. The scope is thus indicated by the appended claims and all changes which come within the meaning and range of equivalency of the claims are therefore intended to be embraced.

What is claimed is:

1. An optoelectronic device, comprising:
   a first organic functional layer structure;
   a second organic functional layer structure; and
   a charge generating layer structure between the first organic functional layer structure and the second organic functional layer structure, wherein the charge generating layer structure comprises:
   a first electron-conducting charge generating layer; wherein the first electron-conducting charge generating layer comprises or is formed from an intrinsically electron-conducting substance;
   a second electron-conducting charge generating layer; and
   an interlayer between first electron-conducting charge generating layer; and second electron-conducting charge generating layer;
   wherein the interlayer comprises at least one phthalocyanine derivative; and
   wherein the interlayer comprises or is formed from the same substance or the same substance mixture as the substance or the substance mixture of the first electron-conducting charge generating layer, wherein however the substance or the substance mixture has a different physical structure, or wherein the interlayer comprises or is formed from the same substance or the same substance mixture as the substance or the substance mixture of the second electron-conducting charge generating layer, wherein however the substance or the substance mixture has a different physical structure.

2. The optoelectronic device as claimed in claim 1, wherein the substance of the first intrinsically electron-conducting charge generating layer comprises or is formed from HAT-(CN)6, Cu(I)pFBz, $MoO_x$, $WO_x$, $VO_x$, $ReO_x$, F4-TCNQ, NDP-2, NDP-9, bi(III)pFBz or F16CuPc.

3. The optoelectronic device as claimed in claim 1, wherein the second organic functional layer structure comprises a hole transport layer, and wherein the hole transport layer is formed above or on the first electron-conducting charge generating layer.

4. The optoelectronic device as claimed in claim 3, wherein the hole transport layer is formed from an intrinsically hole-conducting substance or from a substance mixture comprising matrix and p-type dopant.

5. The optoelectronic device as claimed in claim 1, wherein the second electron-conducting charge generating layer comprises or is formed from an intrinsically electron-conducting substance, or wherein the second electron-conducting charge generating layer is formed from a substance mixture comprising matrix and n-type dopant.

6. The optoelectronic device as claimed in claim 1, wherein the interlayer comprises or is formed from one substance or a plurality of substances, selected from a group consisting of:
   inorganic substance
   organic substance
   organic-inorganic hybrid substance.

7. The optoelectronic device as claimed in claim 1, wherein the at least one phthalocyanine derivative comprises or consists of at least one metal phthalocyanine derivative or metal oxide phthalocyanine derivative or unsubstituted phthalocyanine derivative.

8. The optoelectronic device as claimed in claim 7, wherein the phthalocyanine derivative is selected from the group consisting of: vanadium oxide phthalocyanine (VOPc), titanium oxide phthalocyanine (TiOPc), copper phthalocyanine (CuPc), unsubstituted phthalocyanine ($H_2Pc$), cobalt phthalocyanine (CoPc), aluminum phthalocyanine (AlPc), nickel phthalocyanine (NiPc), iron phthalocyanine (FePc), zinc phthalocyanine (ZnPc) or manganese phthalocyanine (MnPC).

9. The optoelectronic device as claimed in claim 1, wherein the optoelectronic device is designed as an organic light emitting diode.

10. A method for producing an optoelectronic device, the method comprising:
    forming a first organic functional layer structure;
    forming a charge generating layer structure above or on the first organic functional layer structure; and
    forming a second organic functional layer structure above or on the charge generating layer structure, wherein forming the charge generating layer structure comprises:
    forming a second electron-conducting charge generating layer;
    forming an interlayer above or on the second electron-conducting charge generating layer;
    wherein the interlayer comprises at least one phthalocyanine derivative; and
    wherein the interlayer comprises or is formed from the same substance or the same substance mixture as the substance or the substance mixture of the first electron-conducting charge generating layer, wherein however the substance or the substance mixture has a different physical structure, or wherein the interlayer comprises or is formed from the same substance or the same substance mixture as the substance or the substance mixture of the second electron-conducting charge generating layer, wherein however the substance or the substance mixture has a different physical structure; and
    forming a first electron-conducting charge generating layer above or on the interlayer, wherein the first electron-conducting charge generating layer comprises or is formed from an intrinsically electron-conducting substance.

11. The method as claimed in claim 10,
    wherein the substance of the first intrinsically electron-conducting charge generating layer comprises or is formed from HAT-(CN)6, Cu(I)pFBz, $MoO_x$, $WO_x$, $VO_x$, $ReO_x$, F4-TCNQ, NDP-2, NDP-9, bi(III)pFBz or F16CuPc.

12. The method as claimed in claim 10,
    wherein the at least one phthalocyanine derivative of the interlayer comprises or consists of at least one metal phthalocyanine derivative or metal oxide phthalocyanine derivative or unsubstituted phthalocyanine derivative.

13. The method as claimed in claim 12,
    wherein the metal oxide phthalocyanine of the interlayer is selected from the group consisting of: vanadium oxide phthalocyanine (VOPc), titanium oxide phthalocyanine (TiOPc), copper phthalocyanine (CuPc), unsubstituted phthalocyanine ($H_2Pc$), cobalt phthalocyanine (CoPc), aluminum phthalocyanine (AlPc), nickel phthalocyanine (NiPc), iron phthalocyanine (FePc), zinc phthalocyanine (ZnPc) or manganese phthalocyanine (MnPC).

14. The method as claimed in claim 10, wherein the optoelectronic device is produced as an organic light emitting diode.

\* \* \* \* \*

UNITED STATES PATENT AND TRADEMARK OFFICE
CERTIFICATE OF CORRECTION

PATENT NO.         : 9,287,519 B2
APPLICATION NO.    : 14/469636
DATED              : March 15, 2016
INVENTOR(S)        : Arndt Jaeger et al.

It is certified that error appears in the above-identified patent and that said Letters Patent is hereby corrected as shown below:

In the specification

Column 20, line 16: Please delete "phenyl)" between the words "phenyl)" and "borane;".

Column 26, line 3: Please delete subscript "6" after "(CN)" and add "6" in place thereof.

Column 27, line 15: Please delete subscript "6" after "(CN)" and add "6" in place thereof.

Signed and Sealed this
Fourteenth Day of June, 2016

Michelle K. Lee
*Director of the United States Patent and Trademark Office*